(12) United States Patent
Yang

(10) Patent No.: US 11,935,788 B2
(45) Date of Patent: Mar. 19, 2024

(54) SEMICONDUCTOR DIE AND MANUFACTURING METHOD OF SEMICONDUCTOR DEVICE

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 212 days.

(21) Appl. No.: 17/137,298

(22) Filed: Dec. 29, 2020

(65) Prior Publication Data

US 2022/0172992 A1   Jun. 2, 2022

(30) Foreign Application Priority Data

Dec. 2, 2020 (CN) .......................... 202011398658.4

(51) Int. Cl.
 *H01L 23/544* (2006.01)
 *H01L 21/78* (2006.01)
(52) U.S. Cl.
 CPC ............ *H01L 21/78* (2013.01); *H01L 23/544* (2013.01)
(58) Field of Classification Search
 CPC ........................................................ H01L 21/78
 See application file for complete search history.

(56) References Cited

U.S. PATENT DOCUMENTS

| | | | |
|---|---|---|---|
| 10,163,709 B2 | 12/2018 | Yu | |
| 2005/0202651 A1* | 9/2005 | Akram | B28D 1/221 438/463 |
| 2008/0150087 A1 | 6/2008 | Farooq | |
| 2014/0225220 A1* | 8/2014 | Tamagawa | H01L 27/0802 257/529 |
| 2019/0267362 A1* | 8/2019 | Feil | H01L 24/08 |

FOREIGN PATENT DOCUMENTS

| | | | | |
|---|---|---|---|---|
| CN | 108962764 A | * | 12/2018 | ............. H01L 21/50 |
| JP | 2004031844 A | * | 1/2004 | |
| JP | 2005175148 A | * | 6/2005 | |

* cited by examiner

*Primary Examiner* — Mohammad M Choudhry
(74) *Attorney, Agent, or Firm* — Winston Hsu

(57) ABSTRACT

A manufacturing method of a semiconductor device includes the following steps. A singulation process is performed to a semiconductor wafer for forming semiconductor dies and includes a first cutting step, a thinning step, and a second cutting step. The first cutting step is configured to form first openings in the semiconductor wafer by etching. A portion of the semiconductor wafer is located between each first opening and a back surface and removed by the thinning step. Each first opening penetrates through the semiconductor wafer after the thinning step. The second cutting step is configured to form second openings. Each second opening penetrates through the semiconductor wafer for separating the semiconductor dies. A semiconductor die includes two first side surfaces opposite to each other and two second side surfaces opposite to each other. A roughness of each first side surface is different from a roughness of each second side surface.

16 Claims, 26 Drawing Sheets

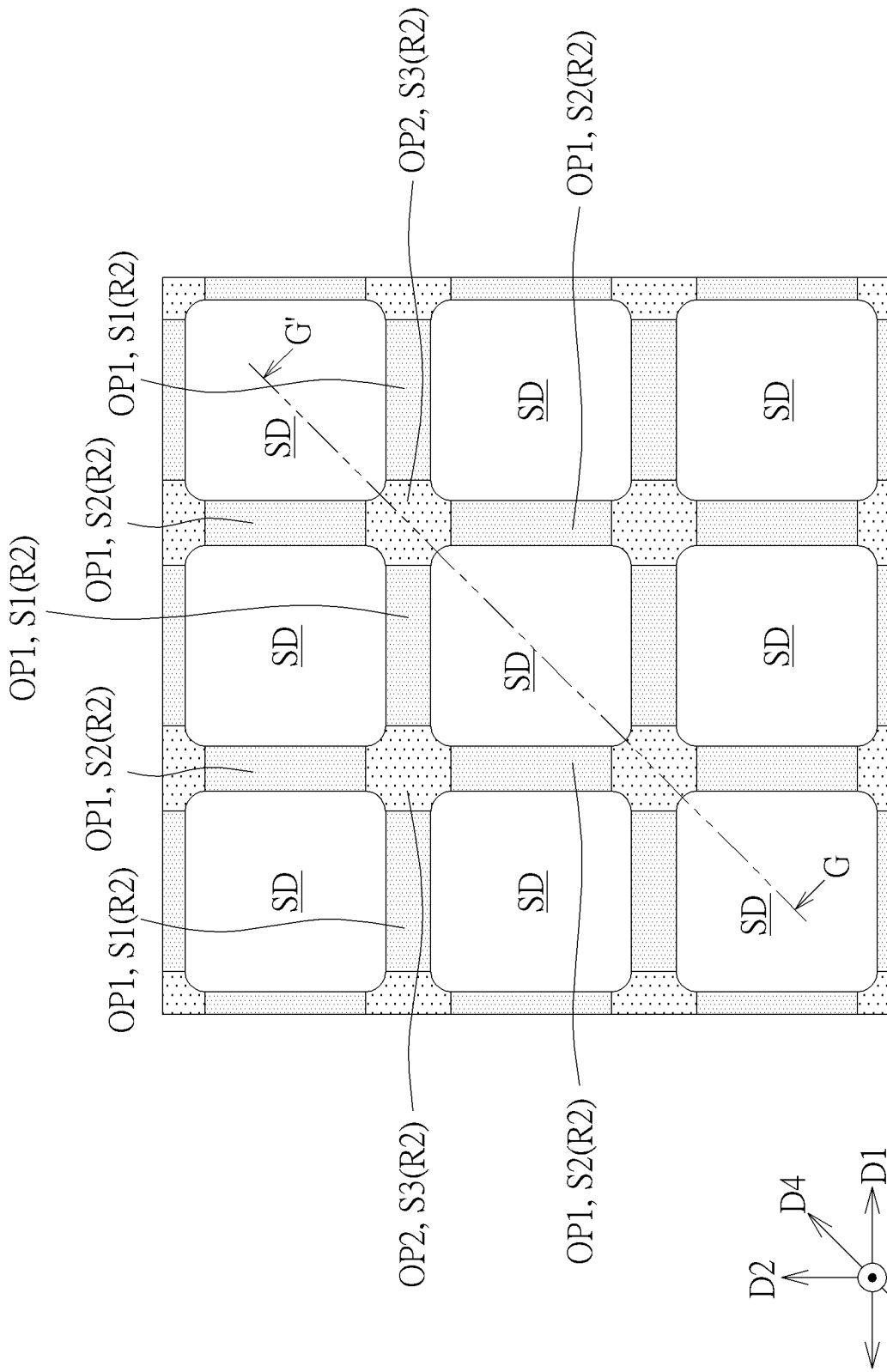

SEMICONDUCTOR DIE AND MANUFACTURING METHOD OF SEMICONDUCTOR DEVICE

BACKGROUND OF THE INVENTION

1. Field of the Invention

The present invention relates to a semiconductor die and a manufacturing method of a semiconductor device, and more particularly, to a manufacturing method of a semiconductor device including cutting steps and a semiconductor die formed by this manufacturing method.

2. Description of the Prior Art

In today's society, micro-processor systems composed of integrated circuits (IC) have been widely used in all aspects of life, such as household appliances, mobile communication equipment, PCs, etc., all have integrated circuits. Generally, the integrated circuits are formed with dies produced by semiconductor manufacturing processes. The manufacturing process of a die begins with the production of a wafer. Firstly, a plurality of areas are defined on a wafer, and various semiconductor processes such as deposition, lithography, etching or planarization process are performed to each area for forming various required circuits. Subsequently, a cutting process is performed to each area on the wafer for forming the dies, and the dies may be packaged or/and connected with other integrated circuit structures for forming the required semiconductor devices. Therefore, the process yield of the above-mentioned cutting process will directly affect the manufacturing cost of the product, and the area on the wafer occupied by the cutting lane corresponding to the cutting process also directly affects the usable area on the wafer.

SUMMARY OF THE INVENTION

It is one of the objectives of the present invention to provide a semiconductor die and a manufacturing method of a semiconductor device. A first cutting step, a second cutting step, and a thinning step between the first cutting step and the second cutting step are performed to a semiconductor wafer, and the purposes of enhancing the manufacturing yield and/or increasing the usable area on the wafer may be achieved accordingly.

According to an embodiment of the present invention, a semiconductor die is provided. The semiconductor die includes two first side surfaces and two second side surfaces. The two first side surfaces are separated from each other, and the two first side surfaces are opposite to each other in a first direction. The two second side surfaces are separated from each other, and the two second side surfaces are opposite to each other in a second direction perpendicular to the first direction. A roughness of each of the first side surfaces is different from a roughness of each of the second side surfaces.

According to an embodiment of the present invention, a manufacturing method of a semiconductor device is provided. The manufacturing method includes the following steps. A semiconductor wafer is provided. The semiconductor wafer has die regions and a scribe lane region surrounding each of the die regions. A singulation process is performed to the semiconductor wafer for forming semiconductor dies separated from one another. Each of the semiconductor dies is formed in one of the die regions. The singulation process includes a first cutting step, a thinning step, and a second cutting step. A first cutting step is configured for forming first openings in the semiconductor wafer by etching the semiconductor wafer. Each of the first openings is formed in the scribe lane region, and a portion of the semiconductor wafer is located between each of the first openings and a back surface of the semiconductor wafer in a thickness direction of the semiconductor wafer. The thinning step is performed to the semiconductor wafer after the first cutting step. The portion of the semiconductor wafer located between each of the first openings and the back surface of the semiconductor wafer is removed by the thinning step, and each of the first openings penetrates through the semiconductor wafer after the thinning step. The second cutting step is performed after the thinning step for forming second openings. Each of the second openings penetrates through the semiconductor wafer for separating the semiconductor dies.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1, 2, 3A, 3B, 4A, 4B, 5A, 5B, 6A, 6B, and 7-9 are schematic drawings illustrating a manufacturing method of a semiconductor device according to a first embodiment of the present invention, wherein FIG. 2 is a schematic drawing in a step subsequent to FIG. 1, FIG. 3A is a cross-sectional diagram taken along a line A-A' in FIG. 2, FIG. 3B is a cross-sectional diagram taken along a line B-B' in FIG. 2, FIG. 4A is a schematic drawing in a step subsequent to FIG. 3A, FIG. 4B is a schematic drawing in a step subsequent to FIG. 3B, FIG. 5A is a schematic drawing in a step subsequent to FIG. 4A, FIG. 5B is a schematic drawing in a step subsequent to FIG. 4B, FIG. 6A is a schematic drawing in a step subsequent to FIG. 5A, FIG. 6B is a schematic drawing in a step subsequent to FIG. 5B, FIG. 7 is a schematic drawing in a step subsequent to FIG. 6B, FIG. 8 is a schematic drawing illustrating a top-view corresponding to FIG. 7, and FIG. 9 is a schematic drawing in a step subsequent to FIG. 7.

FIGS. 13, 14, 15A, 15B, 16, 17A, 17B, 18, and 19 are schematic drawings illustrating a manufacturing method of a semiconductor device according to a third embodiment of the present invention, wherein FIG. 14 is a schematic drawing in a step subsequent to FIG. 13, FIG. 15A is a cross-sectional diagram taken along a line C-C' in FIG. 14 or a cross-sectional diagram taken along a line D-D' in FIG. 14, FIG. 15B is a cross-sectional diagram taken along a line E-E' in FIG. 14, FIG. 16 is a schematic drawing in a step subsequent to FIG. 15A, FIG. 17A is a schematic drawing in a step subsequent to FIG. 16, FIG. 17B is a cross-sectional schematic drawing of FIG. 17A in another direction, FIG. 18 is a schematic drawing in a step subsequent to FIG. 17B, and FIG. 19 is a schematic drawing illustrating a top-view corresponding to FIG. 18.

FIG. 20 is a schematic drawing illustrating a manufacturing method of a semiconductor device according to a fourth embodiment of the present invention.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
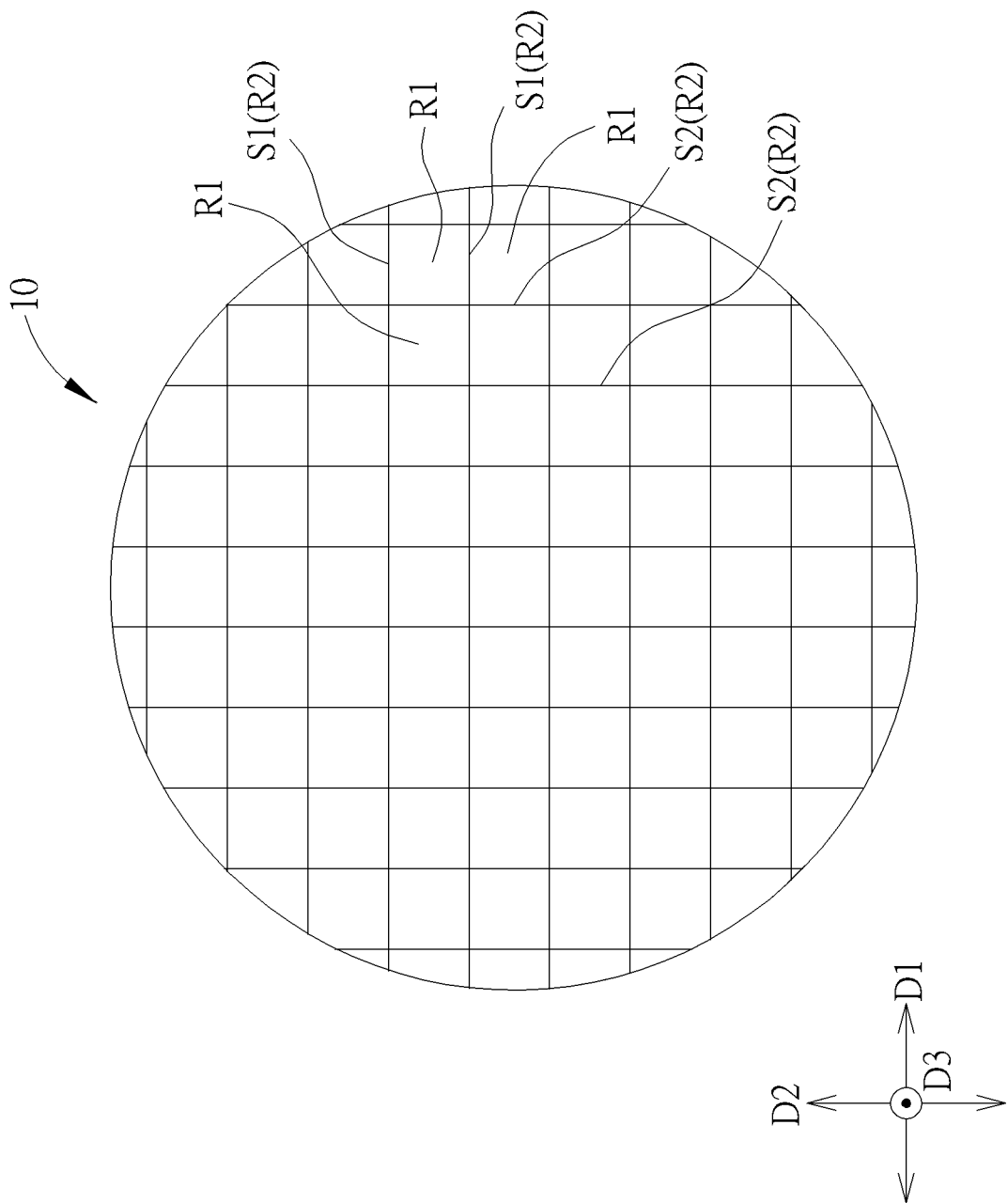
Figure 2:
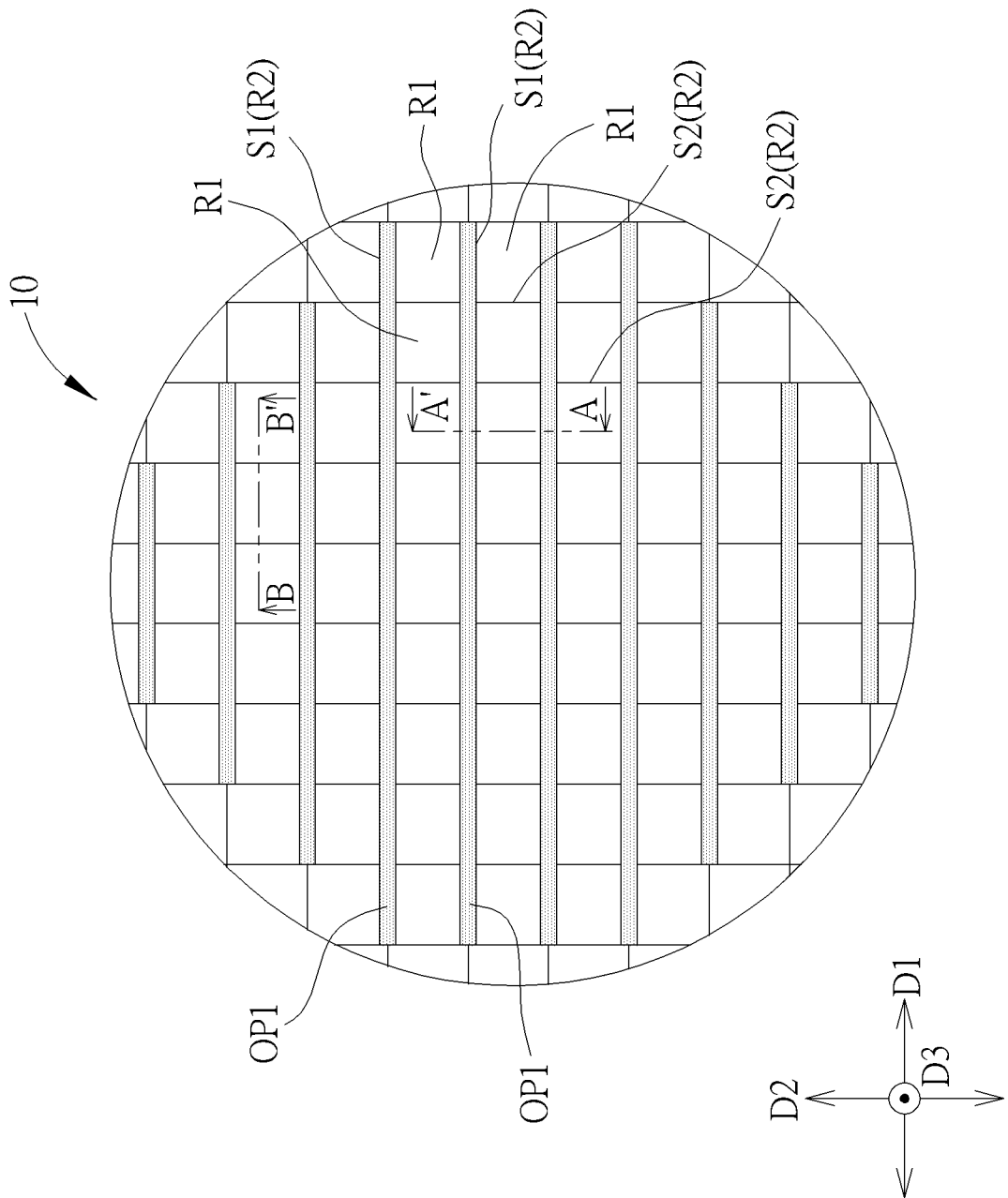
Figure 3A:
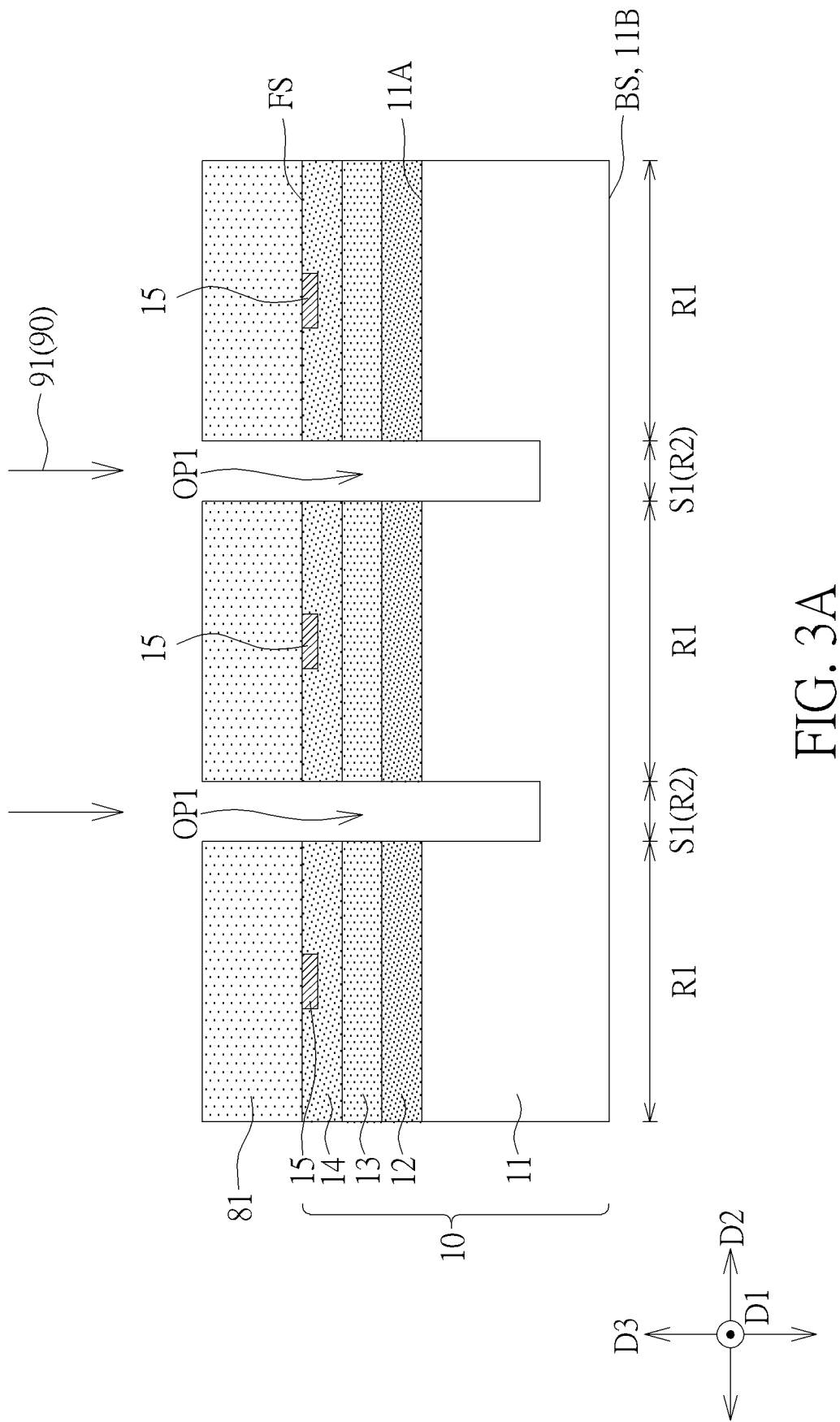
Figure 3B:
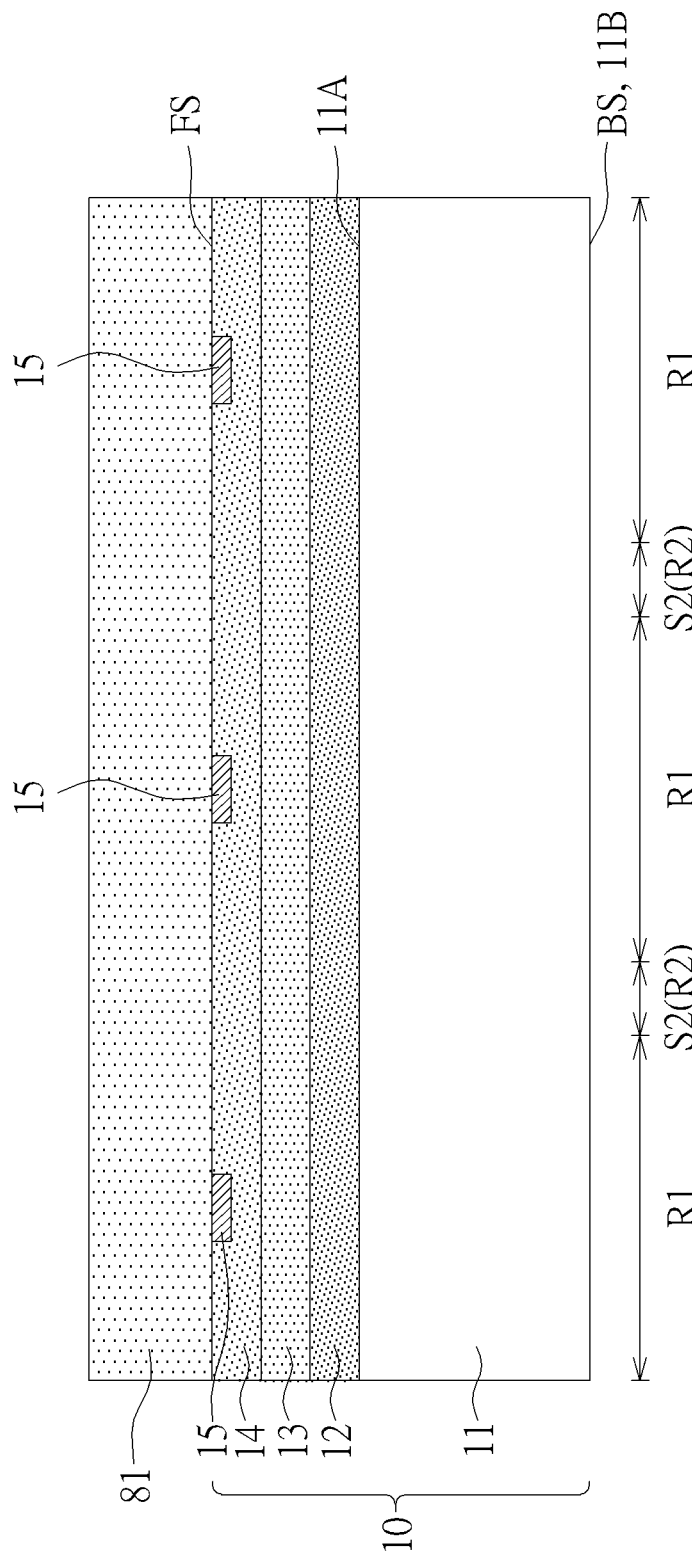
Figure 4A:
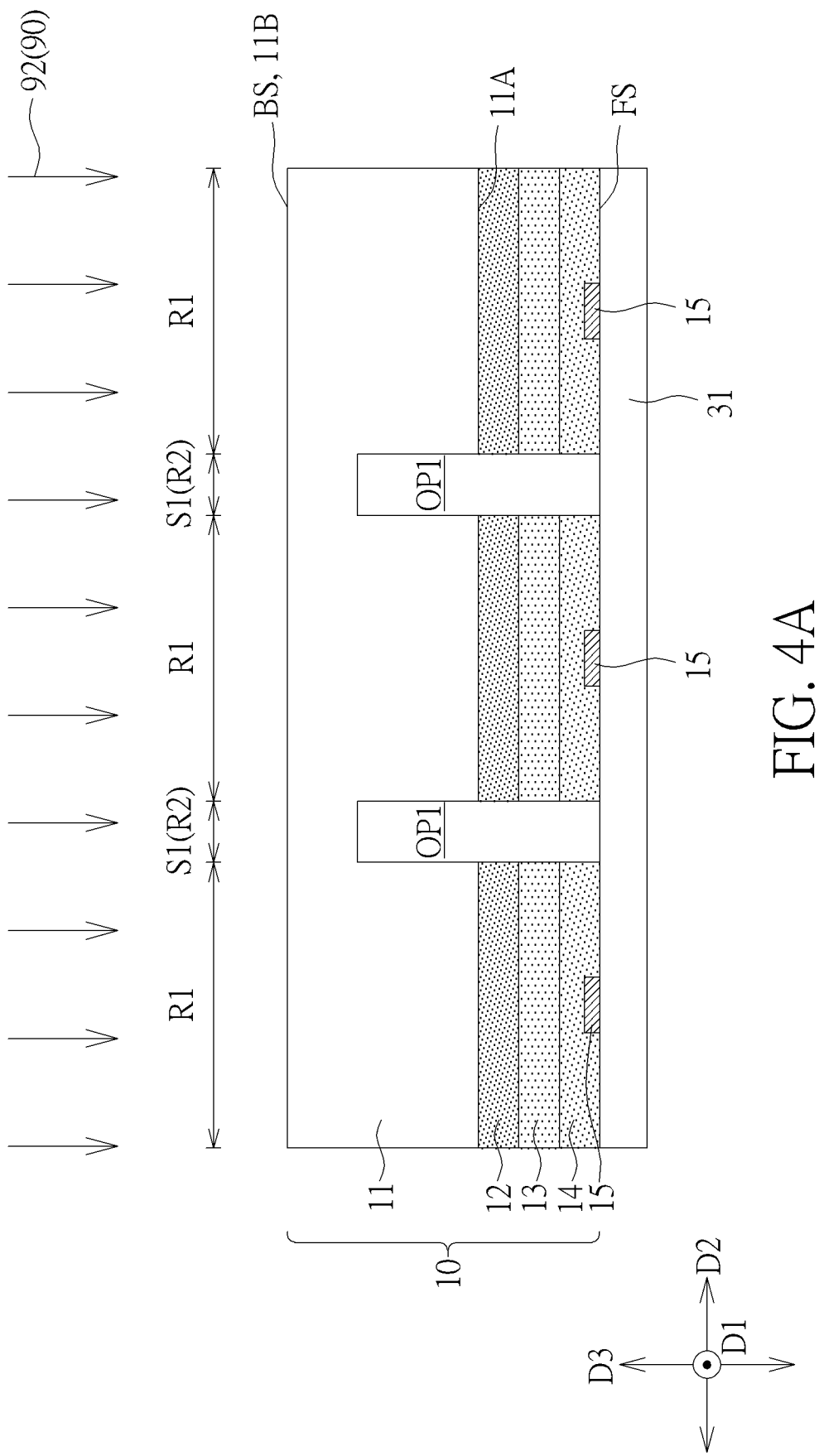
Figure 4B:
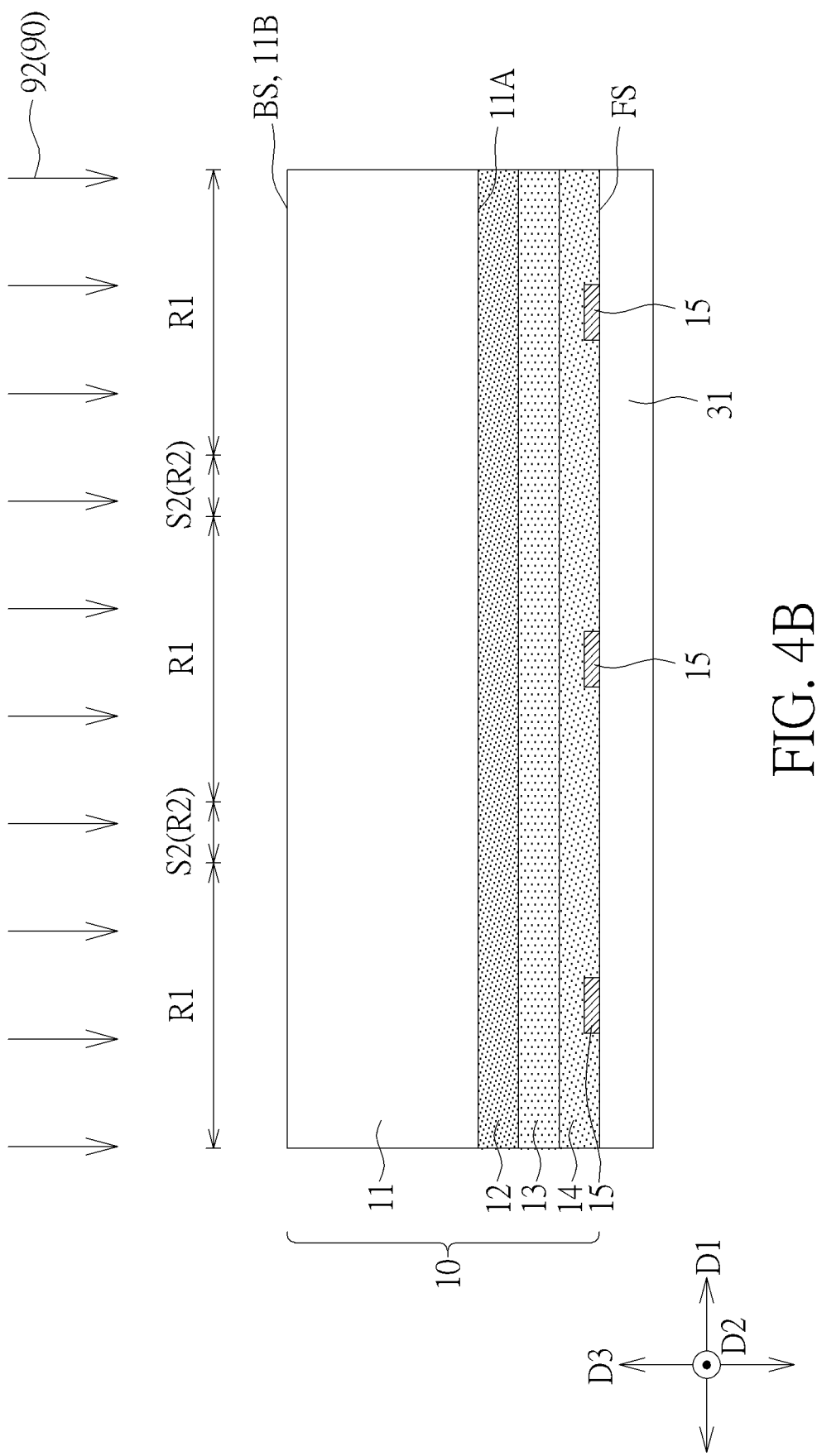
Figure 5A:
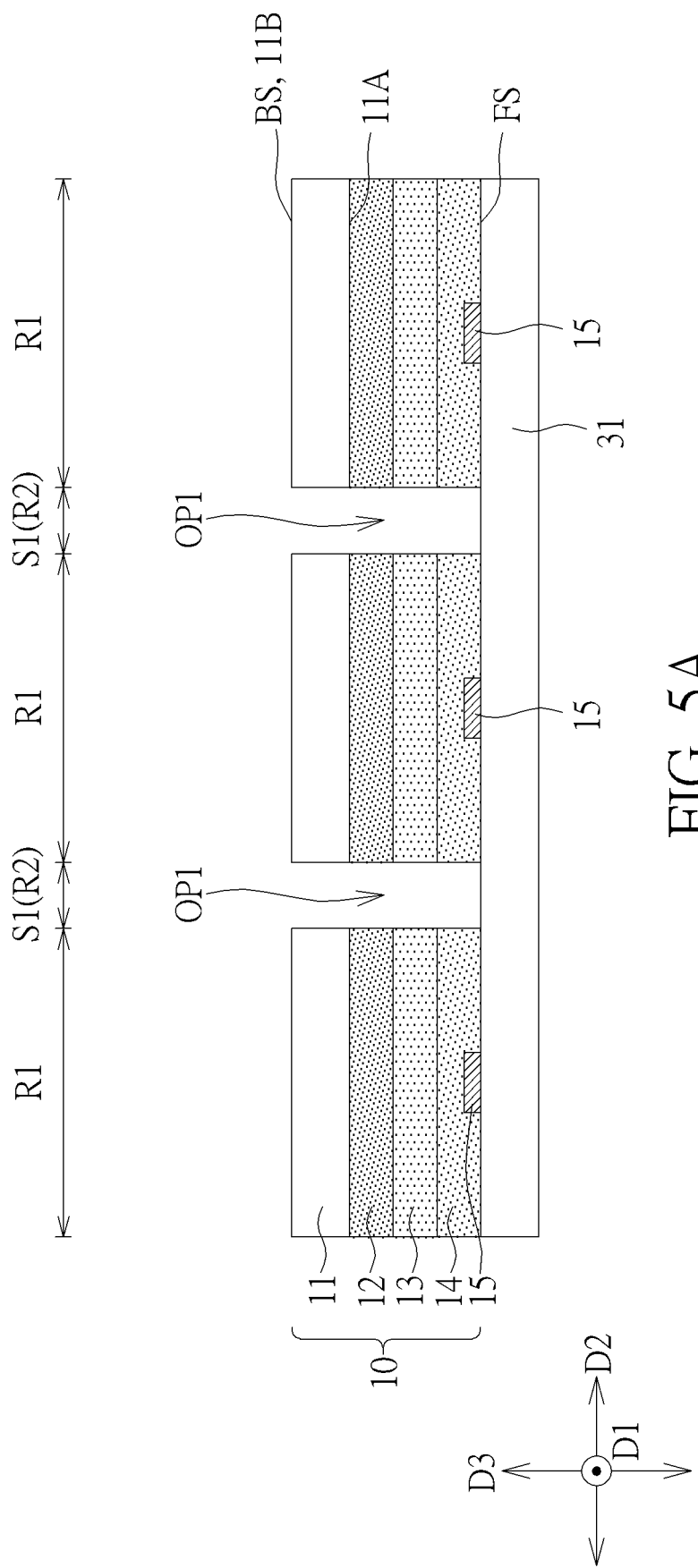
Figure 5B:
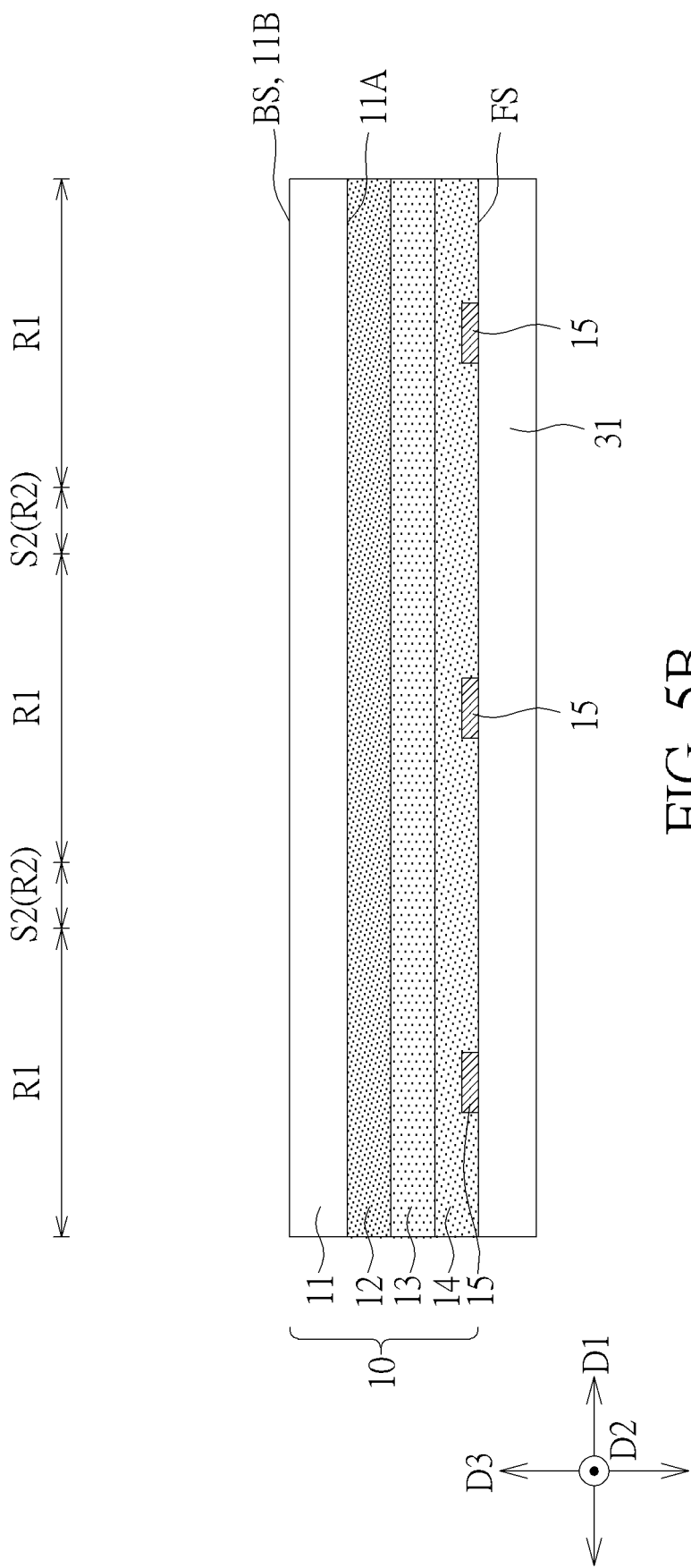
Figure 6A:
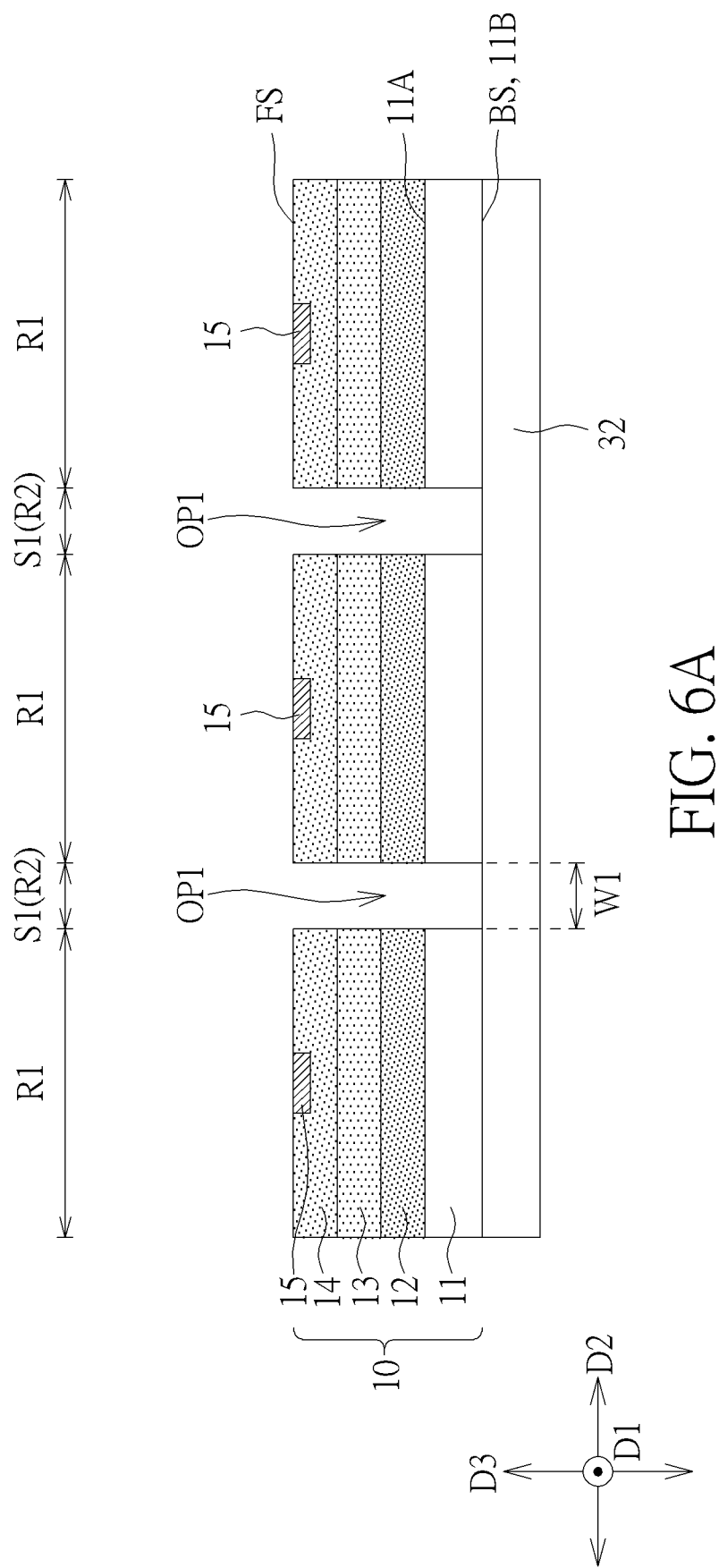
Figure 6B:
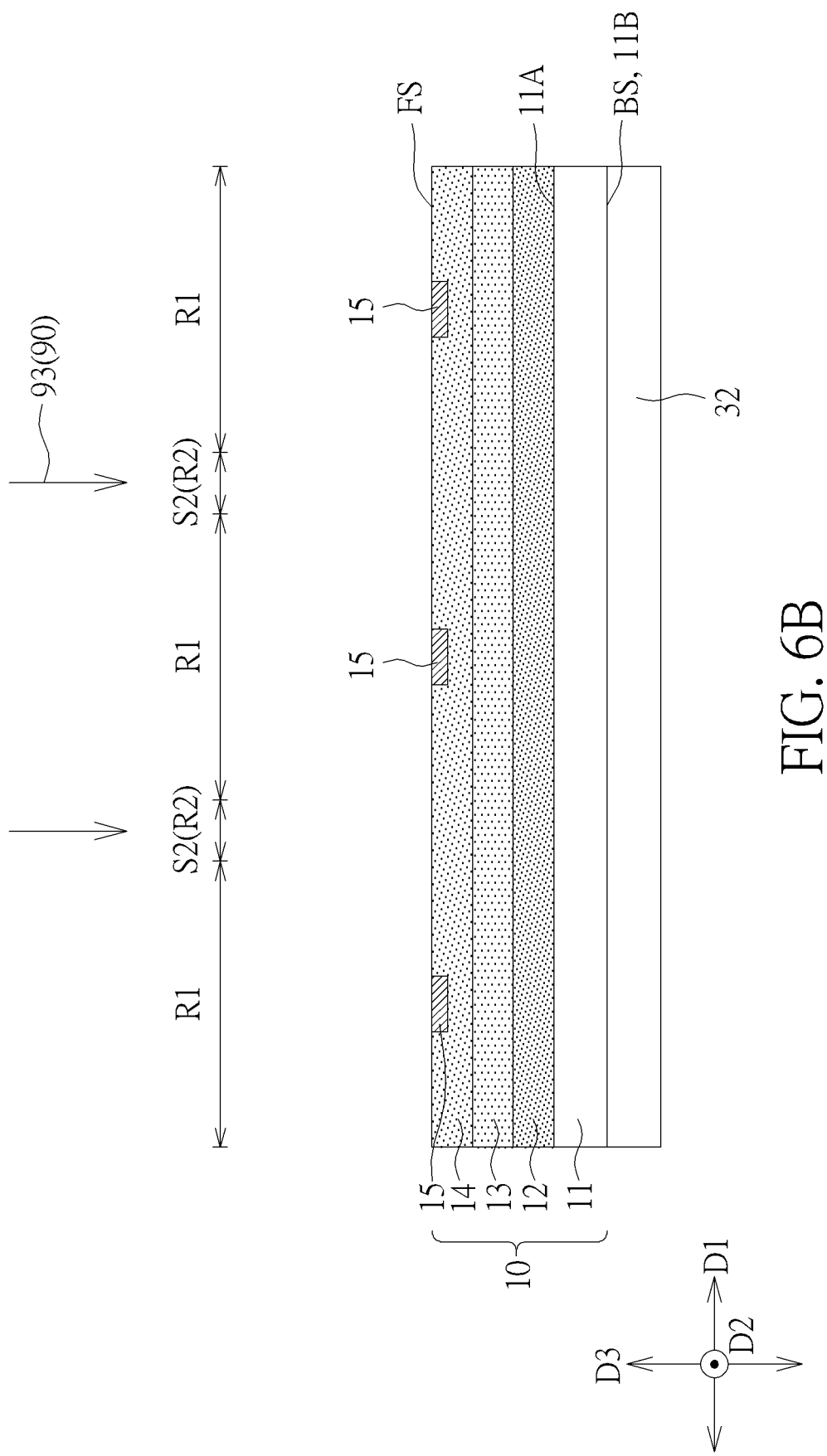
Figure 7:
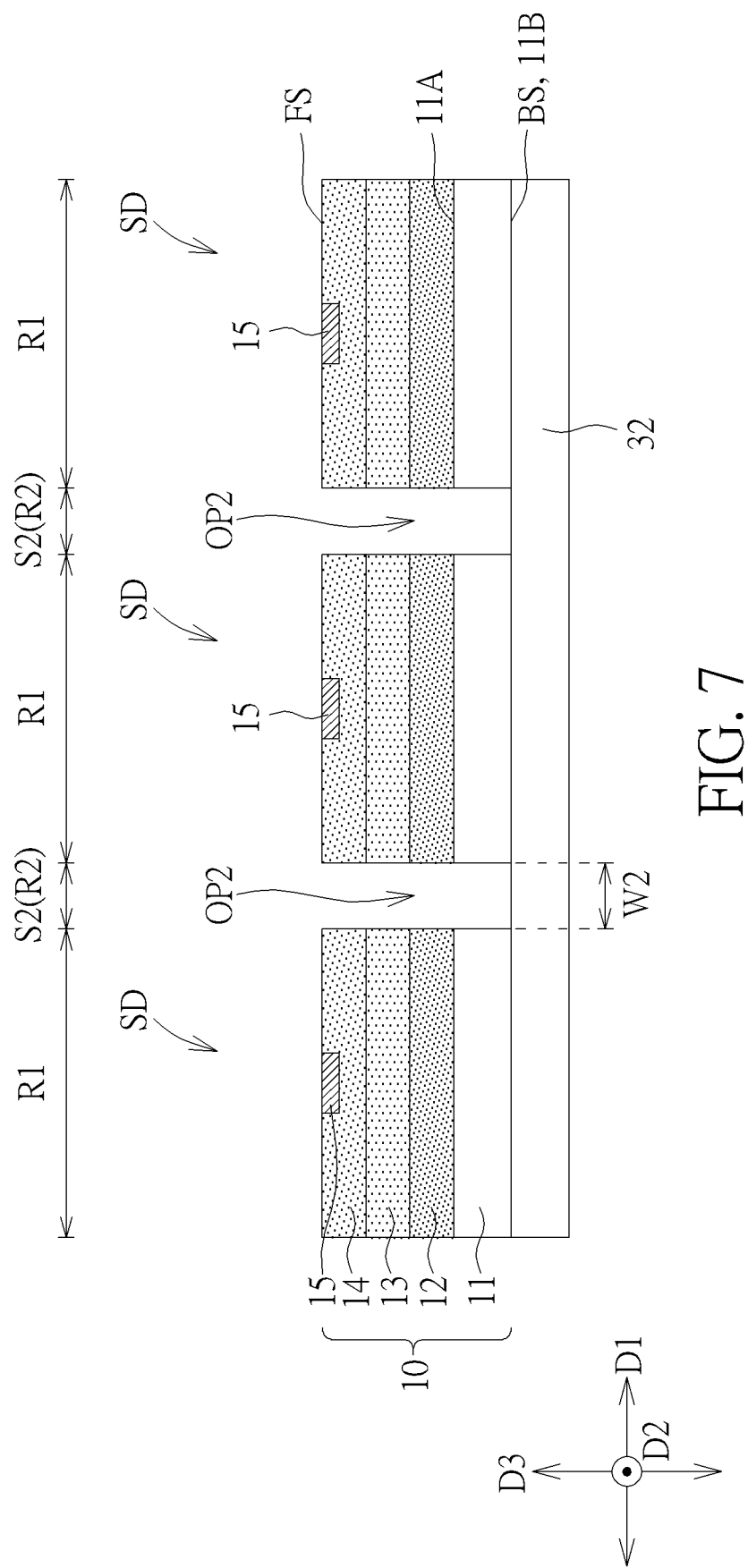
Figure 8:
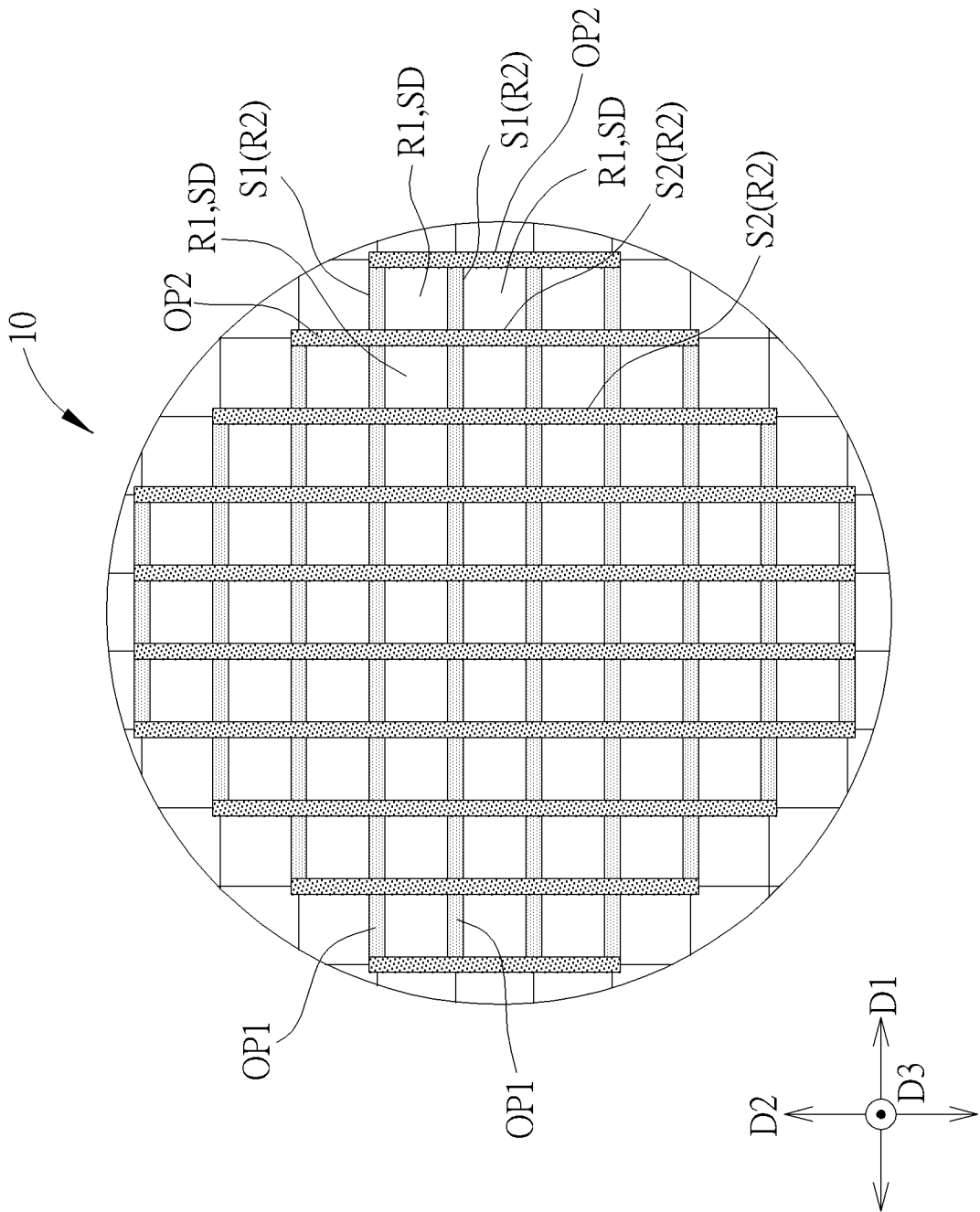
Figure 9:
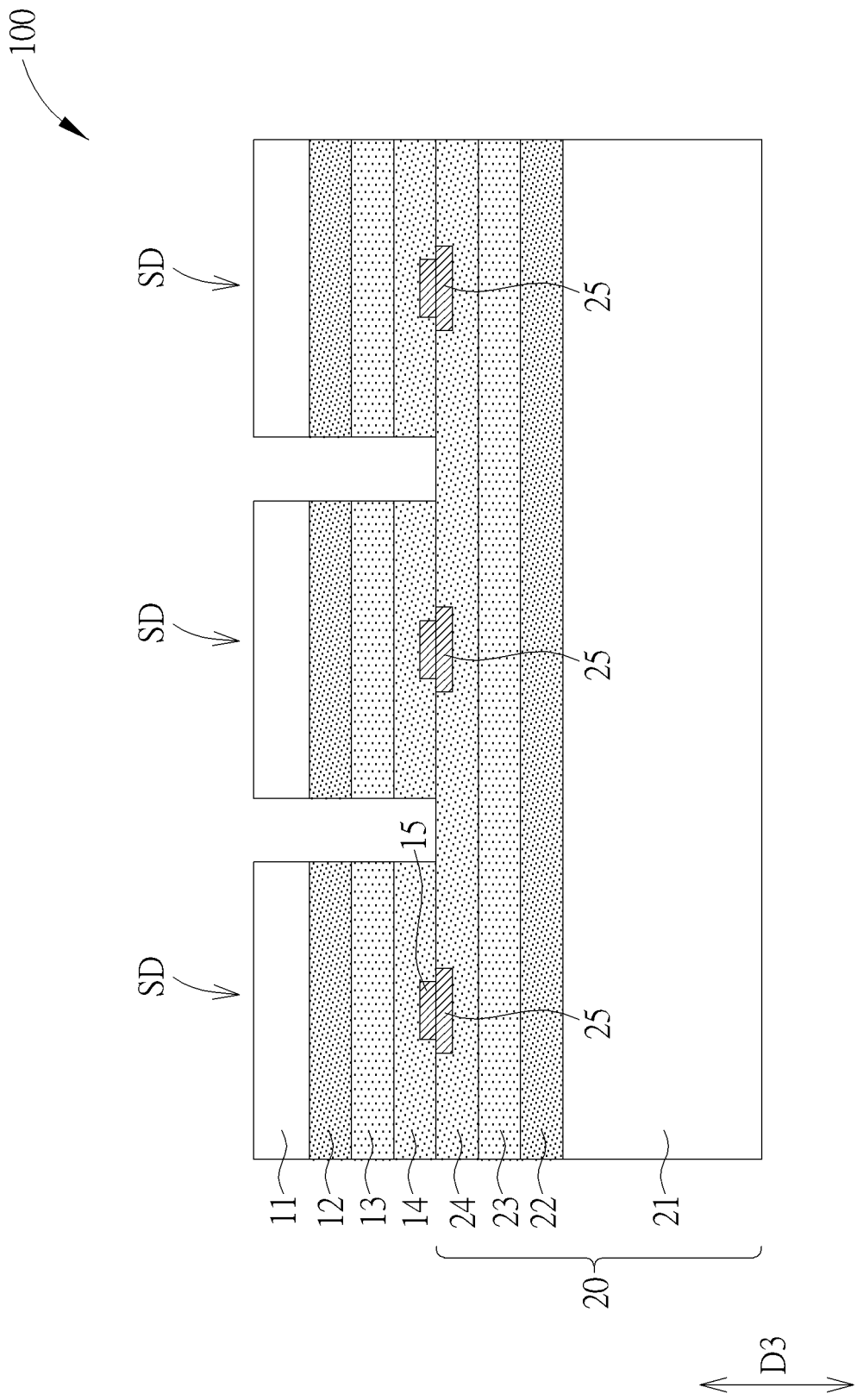

Please refer to FIGS. 1, 2, 3A, 3B, 4A, 4B, 5A, 5B, 6A, 6B, and 7-9. FIGS. 1, 2, 3A, 3B, 4A, 4B, 5A, 5B, 6A, 6B, and 7-9 are schematic drawings illustrating a manufacturing method of a semiconductor device according to a first embodiment of the present invention, wherein FIG. 2 is a schematic drawing in a step subsequent to FIG. 1, FIG. 3A is a cross-sectional diagram taken along a line A-A' in FIG. 2, FIG. 3B is a cross-sectional diagram taken along a line B-B' in FIG. 2, FIG. 4A is a schematic drawing in a step subsequent to FIG. 3A, FIG. 4B is a schematic drawing in a step subsequent to FIG. 3B, FIG. 5A is a schematic drawing in a step subsequent to FIG. 4A, FIG. 5B is a schematic drawing in a step subsequent to FIG. 4B, FIG. 6A is a schematic drawing in a step subsequent to FIG. 5A, FIG. 6B is a schematic drawing in a step subsequent to FIG. 5B, FIG. 7 is a schematic drawing in a step subsequent to FIG. 6B, FIG. 8 is a schematic drawing illustrating a top-view corresponding to FIG. 7, and FIG. 9 is a schematic drawing in a step subsequent to FIG. 7. A manufacturing method of a semiconductor device is provided in this embodiment and includes the following steps. Firstly, as shown in FIG. 1, a semiconductor wafer (such as a first semiconductor wafer 10) is provided. The first semiconductor wafer 10 has a plurality of die regions R1 and a scribe lane region R2, and the scribe lane region R2 surrounds each of the die regions R1. In some embodiments, the scribe lane region R2 may include a plurality of first segments S1 and a plurality of second segments S2. Each of the first segments S1 may be elongated in a first direction D1, each of the second segments S2 may be elongated in a second direction D2, and the second direction D2 may be substantially perpendicular to the first direction D1, but not limited thereto. In some embodiments, the first segments S1 and the second segments S2 of the scribe lane region R2 may intersect and surround each of the die regions R1.

Subsequently, as shown in FIGS. 2, 3A, 3B, 4A, 4B, 5A, 5B, 6A, 6B, 7, and 8, a singulation process 90 is performed to the first semiconductor wafer 10 for forming semiconductor dies SD separated from one another, and each of the semiconductor dies SD is formed in one of the die regions R1. In some embodiments, the singulation process 90 may include a first cutting step (such as a first cutting step 91 shown in FIG. 3A), a thinning step (such as a thinning step 92 shown in FIG. 4A and FIG. 4B), and a second cutting step (such as a second cutting step 93 shown in FIG. 6B). As shown in FIG. 2, FIG. 3A, and FIG. 3B, the first cutting step 91 may be configured for forming a plurality of first openings OP1 in the first semiconductor wafer 10 by etching the first semiconductor wafer 10. Each of the first openings OP1 is formed in the scribe lane region R2, and a portion of the first semiconductor wafer 10 is located between each of the first openings OP1 and a back surface BS of the first semiconductor wafer 10 in a thickness direction of the first semiconductor wafer 10 (such as a third direction D3 shown in FIG. 2, FUG 3A, and FIG. 3B). Subsequently, as shown in FIGS. 3A, 3B, 4A, 4B, 5A, and 5B, the thinning step 92 is performed to the first semiconductor wafer 10 after the first cutting step 91. The portion of the first semiconductor wafer 10 located between each of the first openings OP1 and the back surface BS of the first semiconductor wafer 10 is removed by the thinning step 92, and each of the first openings OP1 may penetrate through the first semiconductor wafer 10 in the third direction D3 after the thinning step 92. As shown in FIGS. 5A, 5B, 6A, 6B, and 7, the second cutting step 93 is performed after the thinning step 92 for forming a plurality of second openings OP2. Each of the second openings OP2 may penetrate through the first semiconductor wafer 10 in the third direction D3 for forming the semiconductor dies SD and separating the semiconductor dies SD.

Specifically, the manufacturing method of this embodiment may include but is not limited to the following steps. As shown in FIG. 2, FIG. 3A, and FIG. 3B, in some embodiments, each of the first openings OP1 may be elongated in the first direction D1 and the first openings OP1 may be parallel with one another, and each of the first openings OP1 may be formed in one of the first segments S1 of the scribe lane region R2. It is worth noting that each of the first openings OP1 may be elongated in the first direction D1 without reaching the edge of the first semiconductor wafer 10 for strengthening the first semiconductor wafer 10 in the thinning step subsequently performed and avoiding separating some portions of the first semiconductor wafer 10 during the thinning step, and the manufacturing yield of the thinning step may be improved accordingly, but not limited thereto.

In some embodiments, the first semiconductor wafer 10 may include a first substrate 11, a first active device layer 12, a first interconnection layer 13, a first passivation layer 14, and at least one first contact pad 15 disposed and stacked in the third direction D3. The first substrate 11 may have a first surface 11A and a second surface 11B. The first surface 11A and the second surface 11B may be opposite to each other in a thickness direction of the first semiconductor wafer 10 (such as the third direction D3). The first surface 11A and the second surface 11B may be the top surface and the bottom surface of the first substrate 11, respectively, and the top surface and the bottom surface may be opposite to each other in the third direction D3, but not limited thereto. In some embodiments, the first active device layer 12, the first interconnection layer 13, the first passivation layer 14, and the first contact pad 15 may be disposed on the first surface 11A of the first substrate 11, the second surface 11B of the first substrate 11 may be regarded as the back surface BS of the first semiconductor wafer 10, and a front surface FS of the first semiconductor wafer 10 which is opposite to the back surface BS in the third direction D3 may be a surface of the passivation layer 14 and/or a surface of the first contact pad 15, but not limited thereto. It is worth noting that the structure of the first semiconductor wafer 10 in the present invention is not limited to the condition described above and may include other required parts according to some design considerations.

In some embodiments, the third direction D3 described above may be regarded as a thickness direction of the first semiconductor wafer 10 and/or a thickness direction of the first substrate 11, and horizontal directions (such as the first direction D1 and the second direction D2 described above) substantially orthogonal to the third direction D3 may be substantially parallel with the back surface BS of the first semiconductor wafer 10, the front surface FS of the first semiconductor wafer 10, the first surface 11A of the first substrate 11, and/or the second surface 11B of the first substrate 11, but not limited thereto. Additionally, in this description, a distance between the first surface 11A of the first substrate 11 and a relatively higher location and/or a relatively higher part in the third direction D3 is greater than a distance between the first surface 11A of the first substrate 11 and a relatively lower location and/or a relatively lower part in the third direction D3. The bottom or a lower portion of each component may be closer to the first surface 11A of the first substrate 11 in the third direction D3 than the top or upper portion of this component. Another component disposed above a specific component may be regarded as being relatively far from the first surface 11A of the first substrate 11 in the third direction D3, and another component disposed under a specific component may be regarded as being relatively closer to the first surface 11A of the first substrate 11 in the third direction D3.

In some embodiments, the first substrate 11 may include a silicon substrate, silicon germanium semiconductor substrate, a silicon-on-insulator (SOI) substrate, or a semiconductor substrate made of other suitable materials. The first active device layer 12 may include active units and/or passive units, such as transistors, diodes, capacitors, resistors, and so forth, and the first interconnection layer 13 may include an interlayer dielectric layer and electrically conductive layers and electrically conductive plugs disposed in the interlayer dielectric layer for being electrically connected with the unit in the first active device layer 12 and/or electrically connecting the unit in the first active device layer 12 and the first contact pad 15, but not limited thereto. The interlayer dielectric layer described above and the passivation layer 14 may include a dielectric material, such as silicon oxide, silicon nitride, silicon oxynitride, a low dielectric constant (low-k) dielectric material, or other suitable dielectric materials. The low-k dielectric material described above may include benzocycyclobutene (BCB), hydrogen silsesquioxane (HSQ), methyl silesquioxane (MSQ), hydrogenated silicon oxycarbide (SiOC—H), a porous dielectric material, or other suitable low-k dielectric materials. The first contact pad 15, the above-mentioned electrically conductive layer, and the above-mentioned electrically conductive plug may include electrically conductive materials, such as tungsten, aluminum, copper, titanium aluminide (TiAl), titanium nitride (TiN), tantalum, tantalum nitride (TaN), titanium aluminum oxide (TiAlO), or other suitable electrically conductive materials.

In some embodiments, the first cutting step 91 may include a dry etching process configured to remove a part of the first semiconductor wafer 10 for forming the first openings OP1 described above, but not limited thereto. In some embodiments, the first cutting step 91 may include other anisotropic etching processes or other suitable etching approaches for forming the first openings OP1 and controlling the depth and the dimension of the first opening OP1. In some embodiments, a first patterned mask layer 81 may be formed on the front surface FS of the first semiconductor wafer 10 for covering the area on the first semiconductor wafer 10 where the first openings OP1 are not going to be formed, and the first patterned mask layer 81 may be regarded as an etching mask in the first cutting step 91, but not limited thereto. The first patterned mask layer 81 may include a single layer or multiple layers of mask materials, such as a photoresist material, an anti-reflection material, an organic dielectric material, or other suitable mask materials, and the first patterned mask layer 81 may be removed after the first cutting step 91 and before the thinning step described above. After the first cutting step 91, a part of each of the first openings OP1 may extend from the first surface 11A of the first substrate 11 toward the second surface 11B of the second substrate 11 in the thickness direction of the first semiconductor wafer 10 (such as the third direction D3), and each of the first openings OP1 does not penetrate through the first semiconductor wafer 10 and the first substrate 11. Therefore, after the first cutting step 91 and before the thinning step described above, a portion of the first substrate 11 may be located between each of the first openings OP1 and the second surface 11B of the first substrate 11 in the third direction D3.

As shown in FIGS. 2, 3A, 3B, 4A, and 4B, after the first cutting step 91 and before the thinning step 92, a protection film 31 may be attached to the front surface FS of the first semiconductor wafer 10, and the thinning step 92 may be performed on the back surface BS of the first semiconductor wafer 10 (i.e. the second surface 11B of the first substrate 11) subsequently for thinning the first substrate 11 in the first semiconductor wafer 10. In some embodiments, the thinning step 92 may include chemical mechanical polishing thinning, etching back, or other suitable physical thinning approaches and/or chemical thinning approaches, and the protection film 31 may include a back grinding tape, an insulation film, or other suitable adhesive protection materials or non-adhesive protection materials for providing protection effect in the thinning step 92. In some embodiments, the thickness of the first substrate 11 may be reduced by the thinning step 92, and the portion located between each of the first openings OP1 and the back surface BS of the first semiconductor wafer 10 (such as the portion of the first substrate 11 located between each of the first openings OP1 and the second surface 11B of the first substrate 11 in the third direction D3) may be removed by the thinning step 92. Therefore, each of the first openings OP1 may penetrate through the first semiconductor wafer 10 after the thinning step 92. It is worth noting that the joint area between the protection film 31 and the front surface FS of the first semiconductor wafer 10 may be relatively increased because the second openings described above do not exist in the thinning step 92, the bonding strength between first semiconductor wafer 10 and the protection film 31 may be increased accordingly, and that is beneficial to the thinning step 92 and the manufacturing yield thereof.

As shown in FIGS. 5A, 5B, 6A, 6B, and 7, after the thinning step 92 and before the second cutting step 93, a support substrate 32 may be attached to the back surface BS of the first semiconductor wafer 10, the protection film 31 may be removed for exposing the front surface FS of the first semiconductor wafer 10, and the second cutting step 93 may be subsequently performed on the front surface FS of the first semiconductor wafer 10 accordingly. In some embodiments, the support substrate 32 may include a tape (such as a PVC film), a metallic substrate, an insulation substrate, such as a silicon substrate, a glass substrate, a plastic substrate, a sapphire substrate, and a ceramic substrate, or other suitable supporting materials. Subsequently, the second cutting step 93 is performed for forming the second openings OP2, and at least a part of the first semiconductor wafer 10 may be cut into a plurality of the semiconductor dies SD separated from one another. As shown in FIG. 7 and FIG. 8, each of the second openings OP2 may penetrate through the first semiconductor wafer 10 in the third direction D3, and each of the second openings OP2 may be elongated in the second direction D2 and formed in one of the second segments S2 of the scribe lane region R2. The first openings OP1 and the second openings OP2 may intersect for cutting at least a portion of the first semiconductor wafer 10 into the semiconductor dies SD separated from one another, and each of the semiconductor dies SD may be formed in the corresponding die region R1.

In some embodiments, the second cutting step 93 may include a saw blade cutting process configured to form the second openings OP2 by using a saw blade to cut the first semiconductor wafer 10 from the front surface FS of the first semiconductor wafer 10, but not limited thereto. In some embodiments, the second cutting step 93 may include other suitable approaches, such as a laser cutting process, a dry etching process, and/or a wet etching process, for forming the second openings OP2 by removing a part of the first semiconductor wafer 10 according to some design considerations, but not limited thereto. Additionally, in some embodiments, a wet etching process may be performed to the semiconductor dies SD after the second cutting step 93 for rounding corners of each of the semiconductor dies SD, but not limited thereto. It is worth noting that, when the first cutting step and the second cutting step described above are carried out by different approaches respectively, a width W1 of the first opening OP1 formed by the first cutting step may be different from a width W2 of the second opening OP2 formed by the second cutting step, and a roughness of a side surface of each semiconductor die SD corresponding to the first opening OP1 may be different from a roughness of a side surface of each semiconductor die SD corresponding to the second opening OP2, but not limited thereto. In addition, the width W1 of the first opening OP1 may be regarded as a length of the first opening OP1 in the second direction D2, and the width W2 of the second opening OP2 may be regarded as a length of the second opening OP2 in the first direction D1. For example, when the first cutting step is a dry etching process and the second cutting step is a saw blade cutting process, the width W2 of each of the second openings OP2 may be greater than the width W1 of each of the first openings OP1, and the roughness of the side surface corresponding to the first opening OP1 in each of the semiconductor dies SD may be lower than the roughness of the side surface corresponding to the second opening OP2 in each of the semiconductor dies SD, but not limited thereto.

In some embodiments, each of the semiconductor dies SD may include the first active device layer 12 and may be regarded as a semiconductor device, but not limited thereto. In some embodiments, the semiconductor die SD formed by the manufacturing method described above may be combined with other parts for forming a requested semiconductor device. For example, as shown in FIG. 7 and FIG. 9, after the step of forming the semiconductor dies SD, the semiconductor dies SD may be bonded to a second semiconductor wafer 20 to be a semiconductor device 100. The second semiconductor wafer 20 may include a second substrate 21, a second active device layer 22, a second interconnection layer 23, a second passivation layer 24, and at least one second contact pad 25 disposed and stacked in the third direction D3. In some embodiments, the materials and/or the structures of the second substrate 21, the second active device layer 22, the second interconnection layer 23, the second passivation layer 24, and the second contact pad 25 may be similar to those of the first substrate 11, the first active device layer 12, the first interconnection layer 13, the first passivation layer 14, and the first contact pad 15 described above, but not limited thereto. Each of the semiconductor dies SD may be electrically connected with the second semiconductor wafer 20 by bonding the first contact pads 15 to the second contact pads 25, and the semiconductor device 100 may be regarded as a chip-on-wafer (CoW) bonding structure, but not limited thereto. In some embodiments, each of the semiconductor dies SD may be separated from the support substrate 32 after the second cutting step, and the semiconductor dies SD may then be bonded to the second semiconductor wafer 20, but not limited thereto. In some embodiments, the support substrate 32 may be removed after aligning and bonding the semiconductor dies SD on the support substrate 32 to the second semiconductor wafer 20, and the support substrate 32 may include a flexible substrate for adjusting the spacing between the semiconductor dies SD on the support substrate 32 and/or the relative position of each of the semiconductor dies SD on the support substrate 32 during bonding, but not limited thereto.

Figure 10:
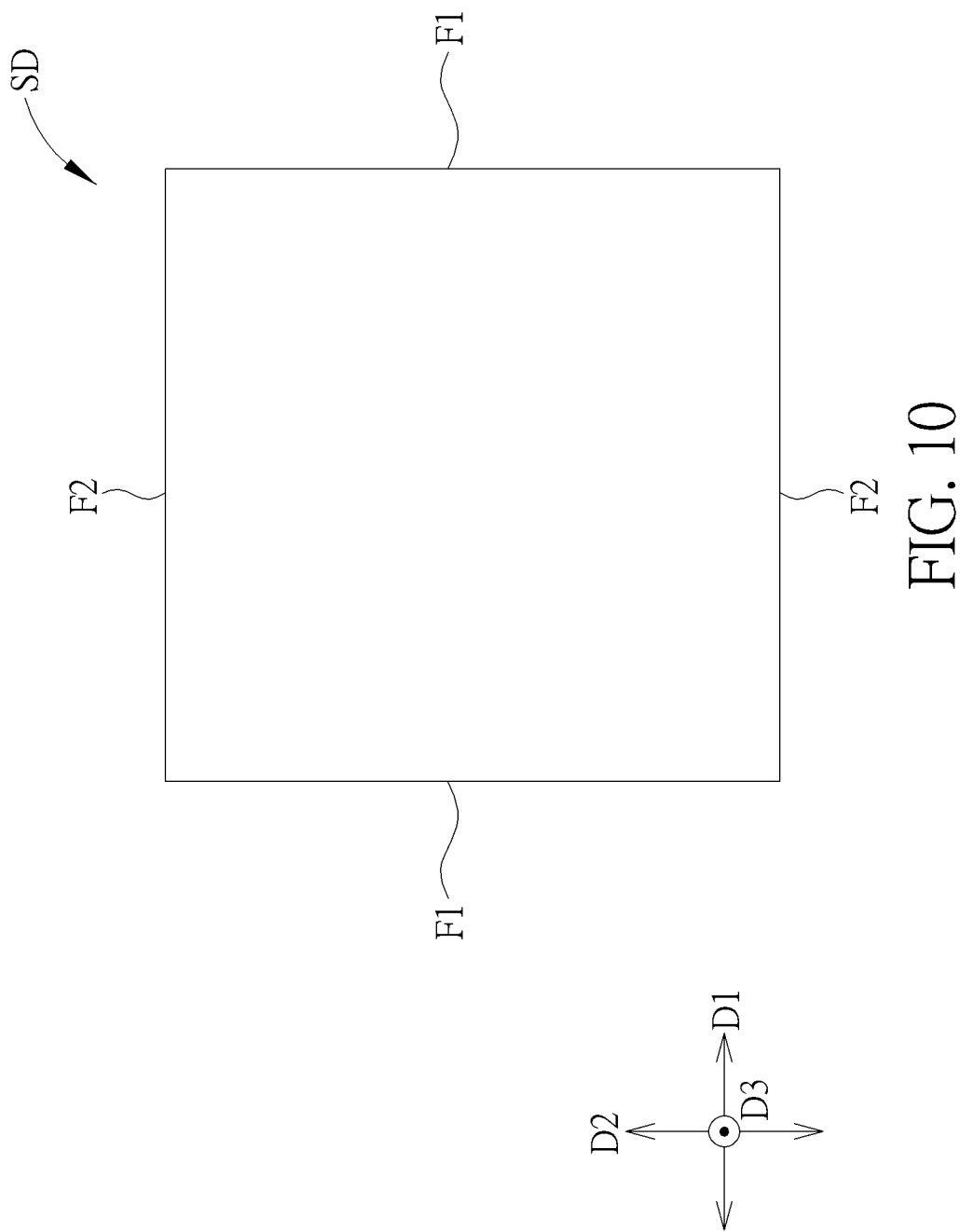
FIG. 10 is a schematic drawing illustrating a top-view of a semiconductor die according to an embodiment of the present invention.
Figure 11:
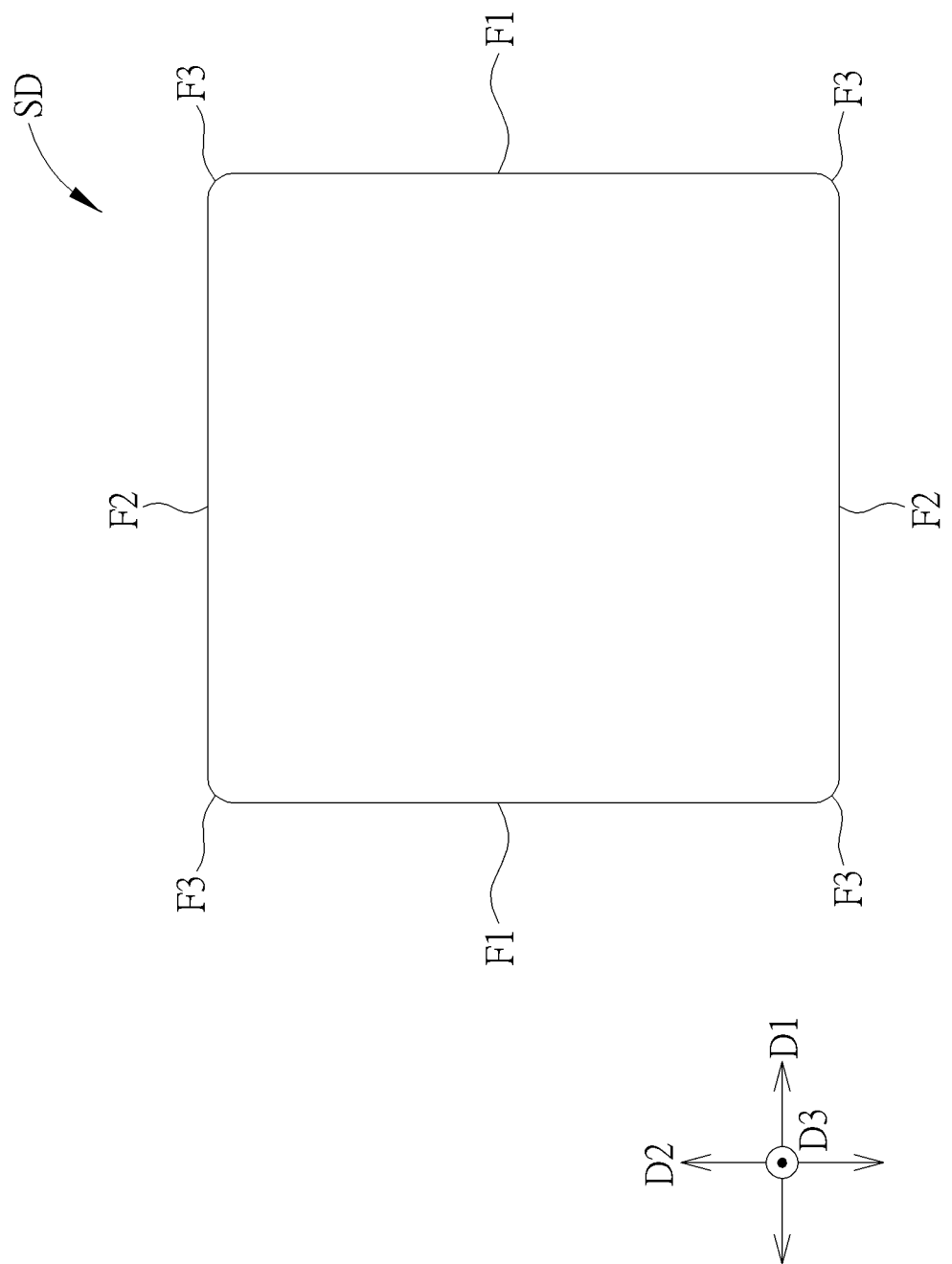
FIG. 11 is a schematic drawing illustrating a top-view of a semiconductor die according to another embodiment of the present invention.

Please refer to FIG. 10 and FIG. 11. FIG. 10 is a schematic drawing illustrating a top-view of the semiconductor die SD according to an embodiment of the present invention, and FIG. 11 is a schematic drawing illustrating a top-view of the semiconductor die SD according to another embodiment of the present invention. As shown in FIG. 10, in some embodiments, the semiconductor die SD may include two first side surfaces F1 separated from each other and two second side surfaces F2 separated from each other. The two first side surfaces F1 are opposite to each other in the first direction D1, and the two second side surfaces F2 are opposite to each other in the second direction D2. The second direction D2 may be perpendicular to the first direction D1, and a roughness of each of the first side surfaces F1 is different from a roughness of each of the second side surfaces F2. In some embodiments, the semiconductor die SD may be formed by the manufacturing method described above, each of the first side surfaces F1 may be located corresponding to the second opening formed by the second cutting step in the manufacturing method described above, and each of the second side surfaces F2 may be located corresponding to the first opening formed by the first cutting step in the manufacturing method described above. Therefore, when the first cutting step and the second cutting step are carried out by different approaches respectively, the roughness of each of the first side surfaces F1 may be different from the roughness of each of the second side surfaces F2. For example, when the first cutting step is a dry etching process and the second cutting step is a saw blade cutting process, the roughness of the second side surface F2 may be lower than the roughness of the first side surface F1, but not limited thereto. Additionally, in some embodiments, each of the first side surfaces F1 may be elongated in the second direction D2, each of the second side surfaces F2 may be elongate in the first direction D1, and each of the first side surfaces F1 may be directly connected with the two second side surfaces F2. In other words, in a top-view diagram of the semiconductor die SD, the shape of the semiconductor die SD may be a rectangle, the two first side surfaces F1 and the two second side surfaces F2 may be the four sides of this rectangle, and the first direction D1 and the second direction D2 may be substantially orthogonal to a thickness direction of the semiconductor die SD (such as the third direction D3), respectively, but not limited thereto.

As shown in FIG. 11, in some embodiments, the semiconductor die SD may further include a plurality of corner side surfaces F3, and each of the corner side surfaces F3 may be directly connected with one of the two first side surfaces F1 and one of the two second side surfaces F2, respectively. In some embodiments, each of the corner side surfaces F3 may be a curved surface, and the curved surface may be formed by the above-mentioned wet etching process performed to the semiconductor die SD after the second cutting process 93 described above, but not limited thereto. Therefore, a roughness of each of the corner side surfaces F3 may be different from the roughness the each of the first side surfaces F1 and/or the roughness of each of the second side surfaces F2. The stress damage at the corners of the semiconductor die SD may be reduced by rounding the corner side surfaces F3, and that is beneficial to manufacturing yield of subsequent processes performed to the semiconductor die SD (such as a packaging process, but not limited thereto).

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 12:
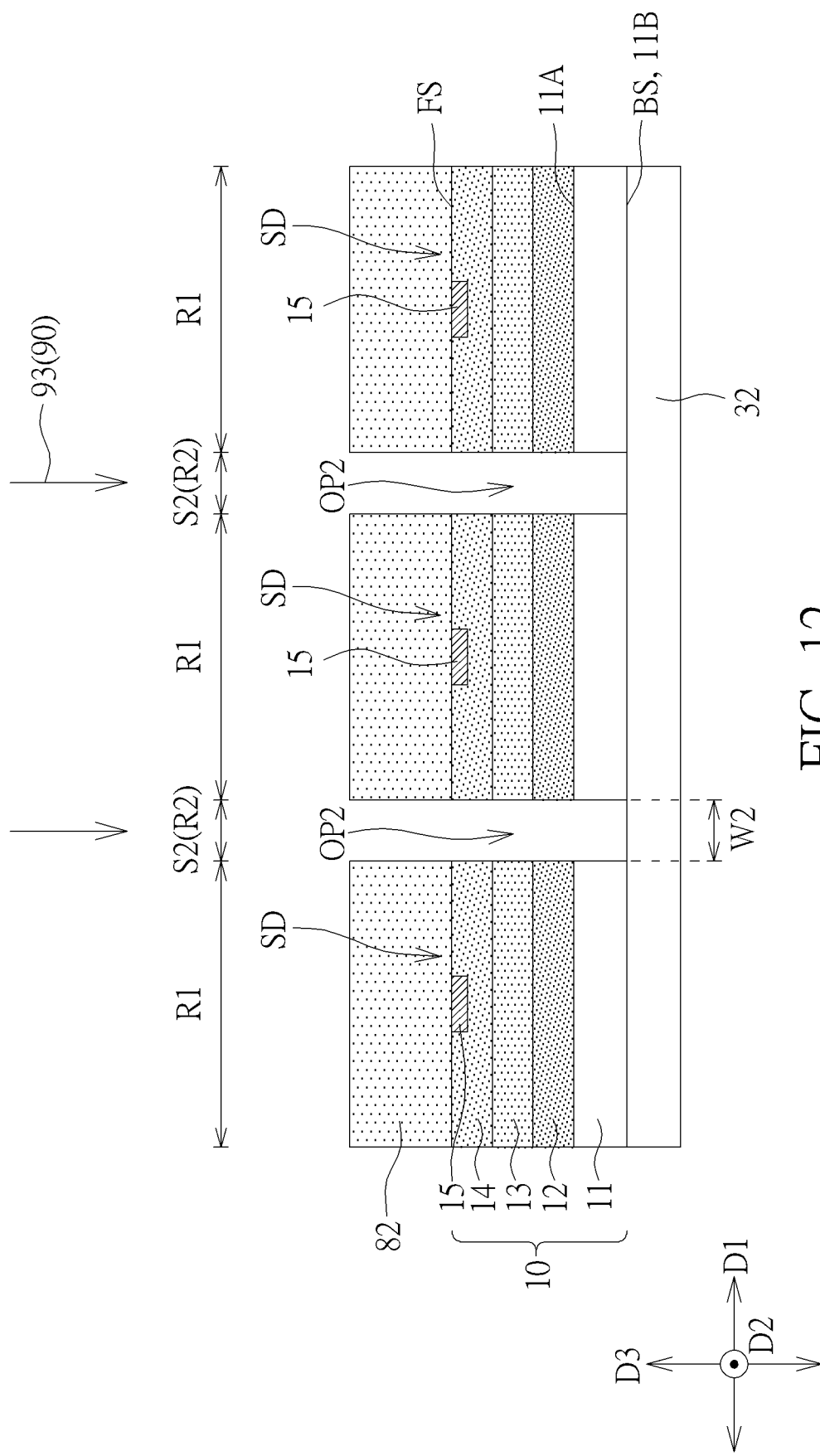
FIG. 12 is a schematic drawing illustrating a manufacturing method of a semiconductor device according to a second embodiment of the present invention.

Please refer to FIG. 12. FIG. 12 is a schematic drawing illustrating a manufacturing method of a semiconductor device according to a second embodiment of the present invention. As shown in FIG. 12, the second cutting step 93 in this embodiment may include a dry etching process configured to remove a part of the first semiconductor wafer 10 for forming the second openings OP2. In some embodiments, a second patterned mask layer 82 may be formed on the front surface FS of the first semiconductor wafer 10 for covering the area on the first semiconductor wafer 10 where the second openings OP2 are not going to be formed, and the second patterned mask layer 82 may be regarded as an etching mask in the second cutting step 93, but not limited thereto. The second patterned mask layer 82 may include a single layer or multiple layers of mask materials, such as a photoresist material, an anti-reflection material, an organic dielectric material, or other suitable mask materials, and the second patterned mask layer 82 may be removed after the second cutting step 93. In other words, in some embodiments, the first cutting step and the second cutting step described above may be carried out with etching respectively, and the thinning step may be carried out between the first cutting step and the second cutting step. The second cutting step using etching may be used to reduce the width W2 of the second opening OP2, and the usable area on the first semiconductor wafer 10 may be relatively increased accordingly.

Figure 13:
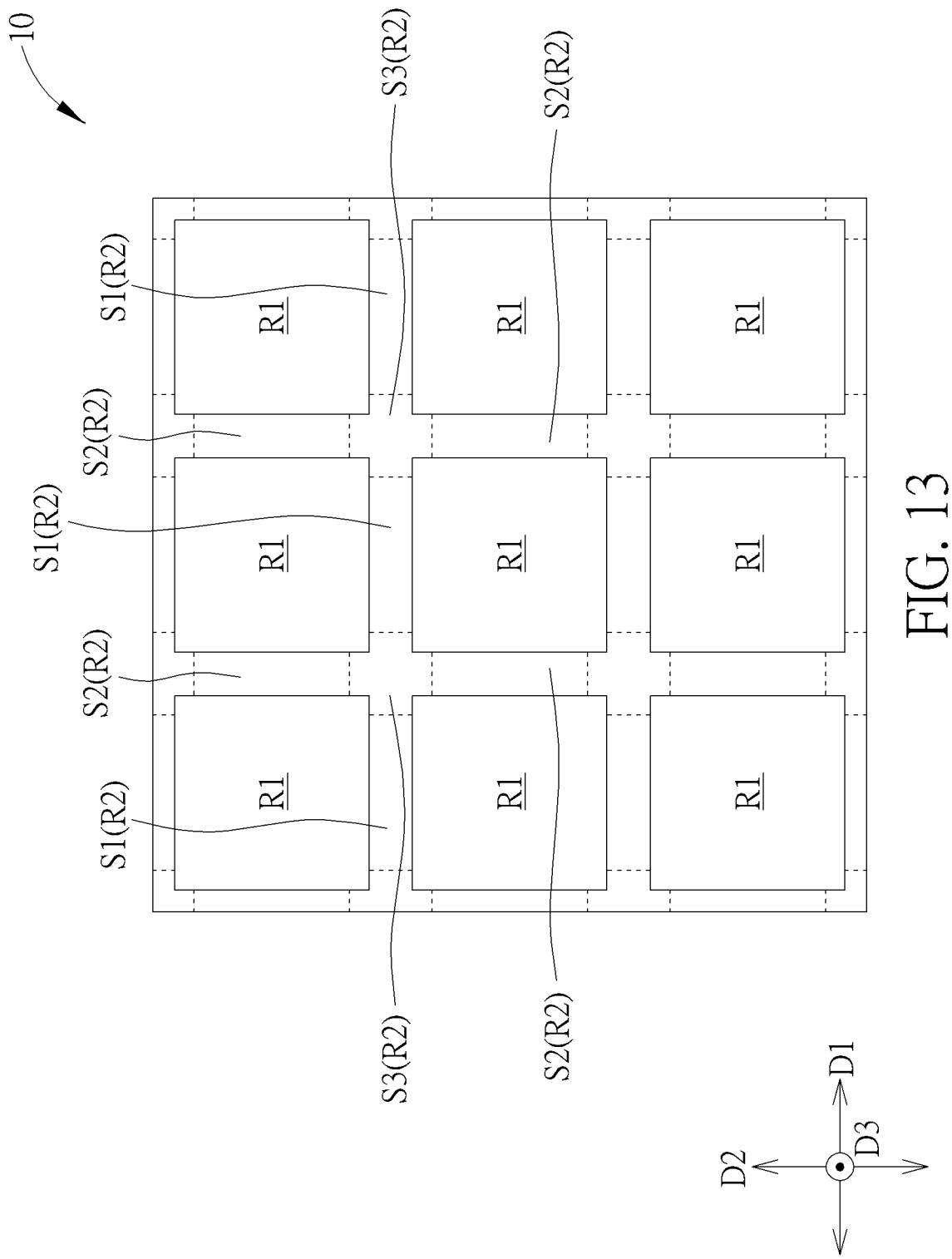
Figure 14:
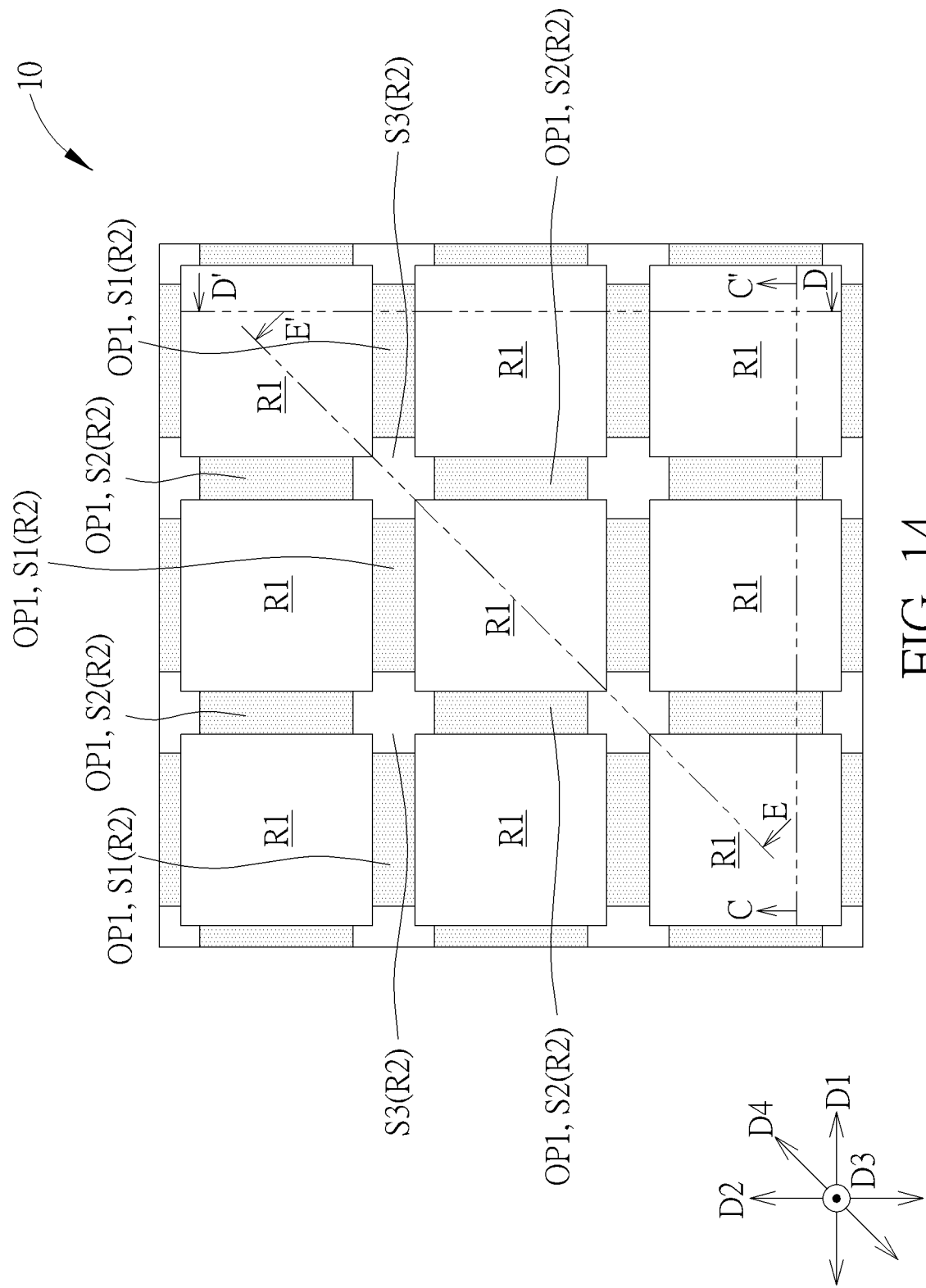
Figure 15A:
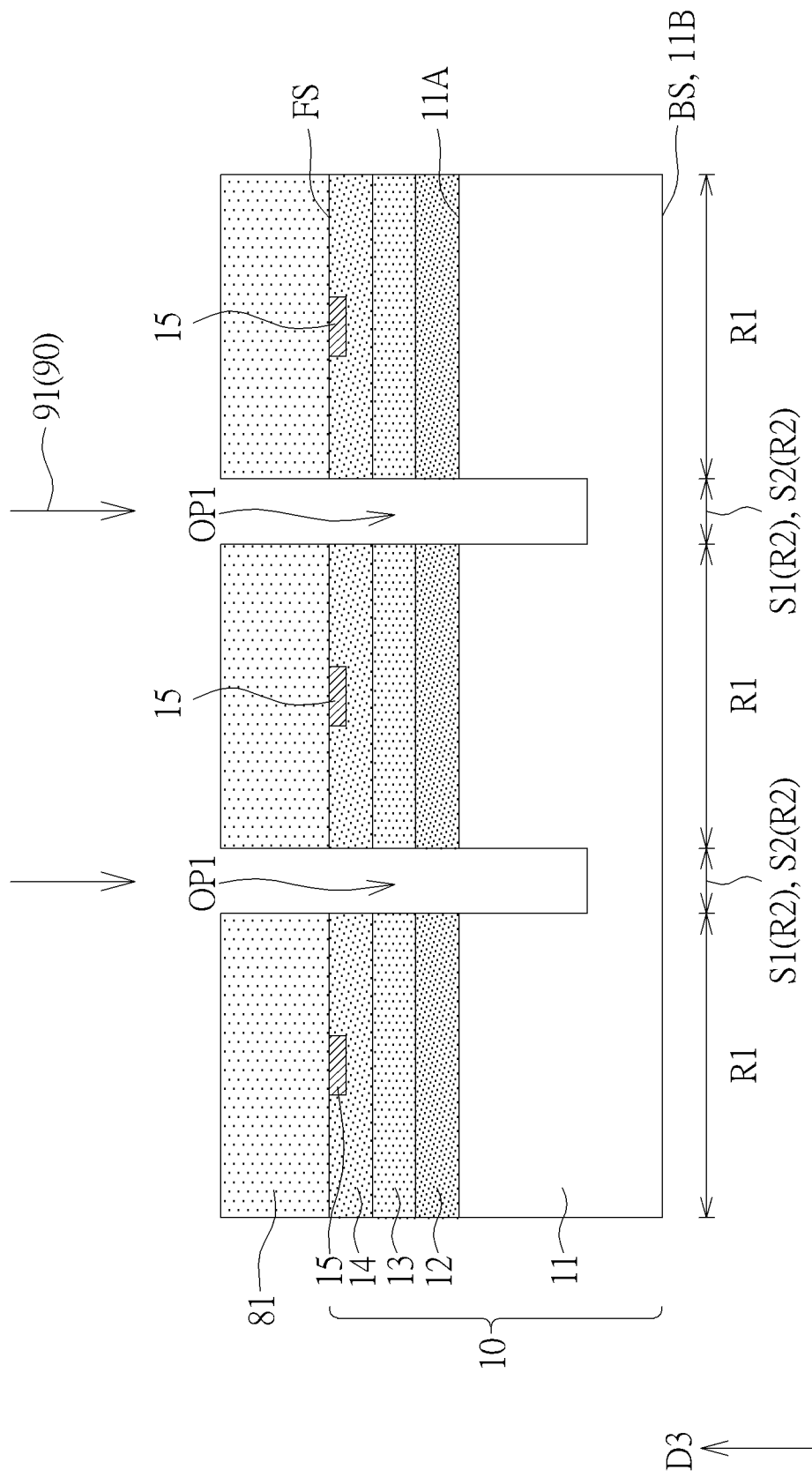
Figure 15B:
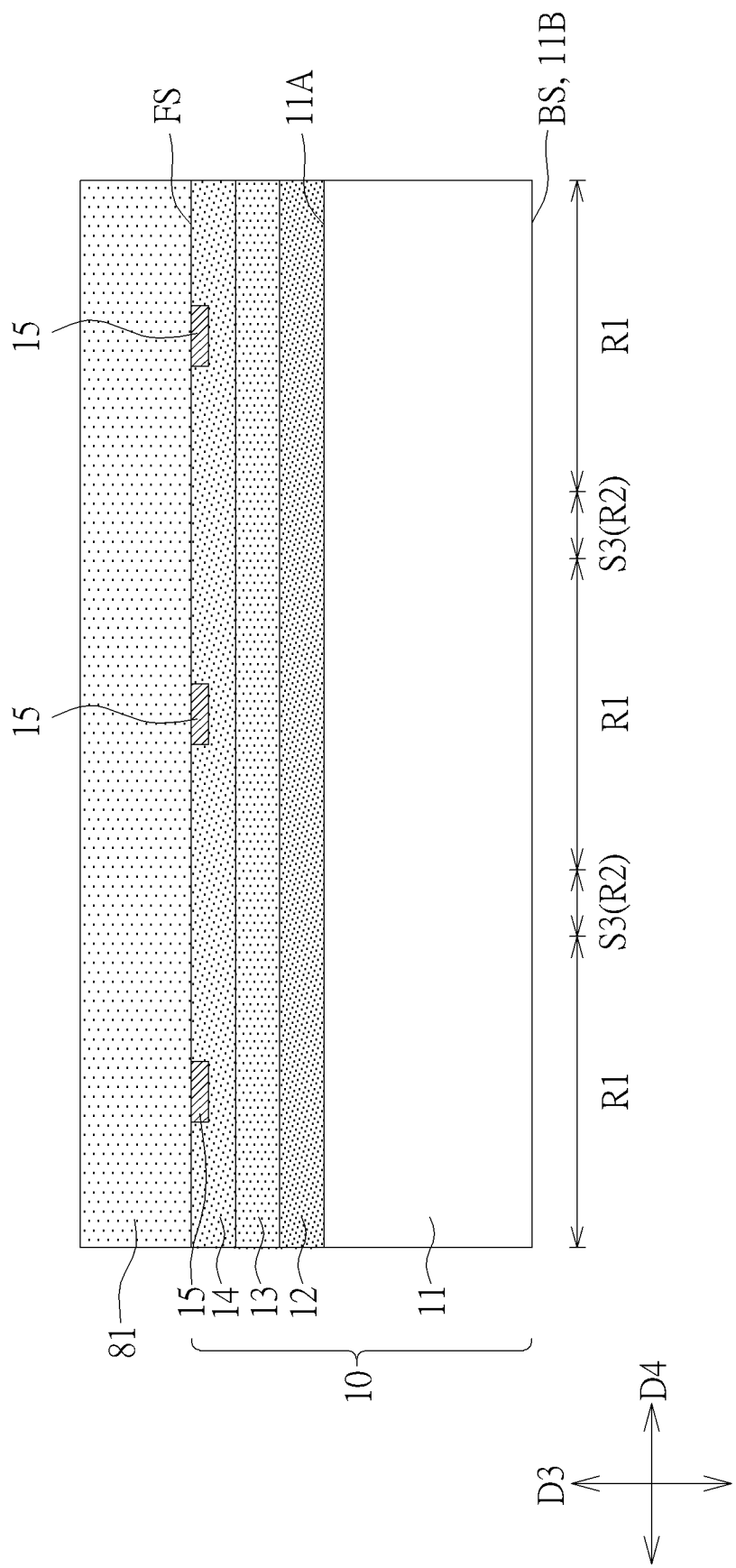
Figure 16:
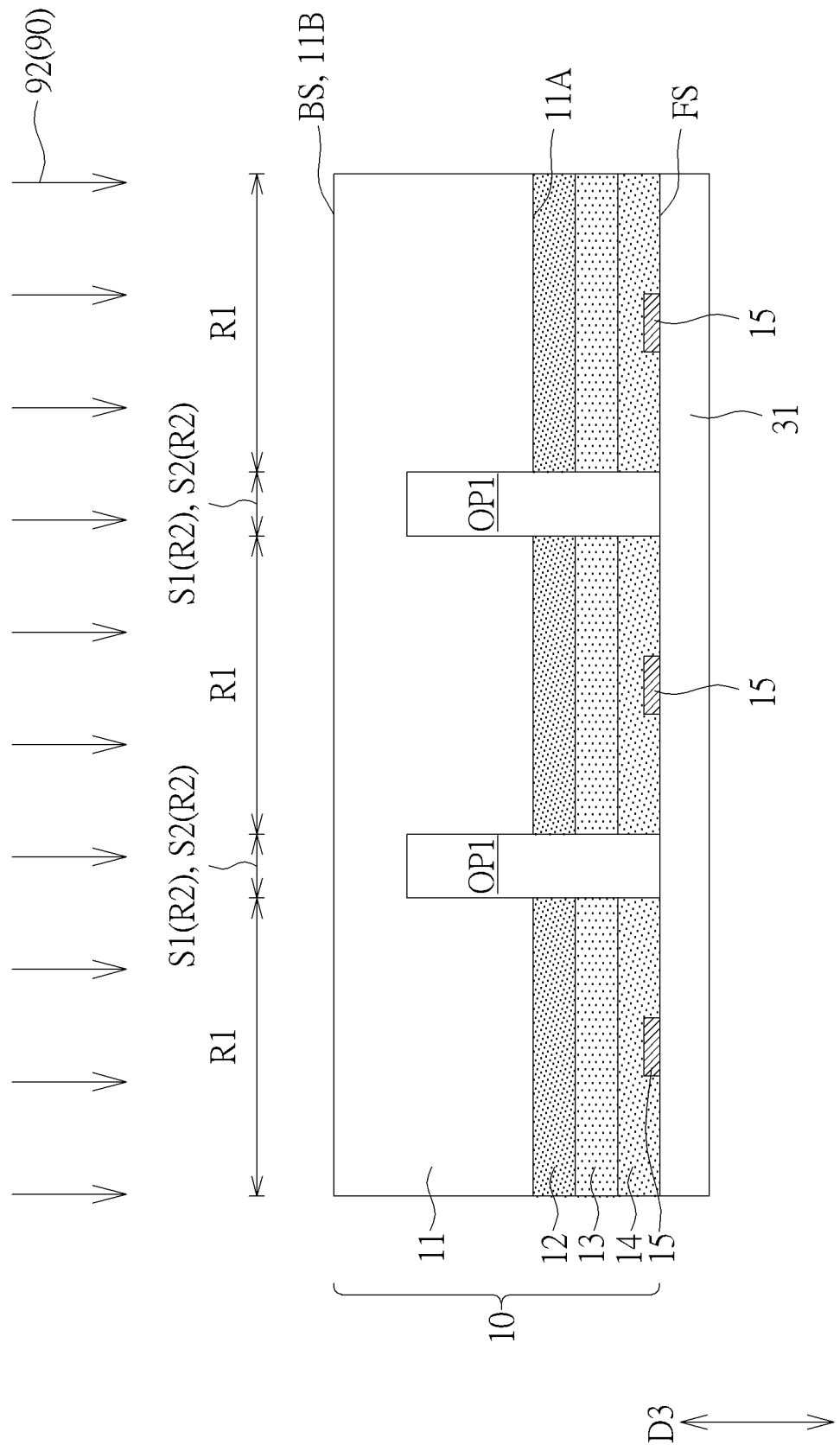
Figure 17A:
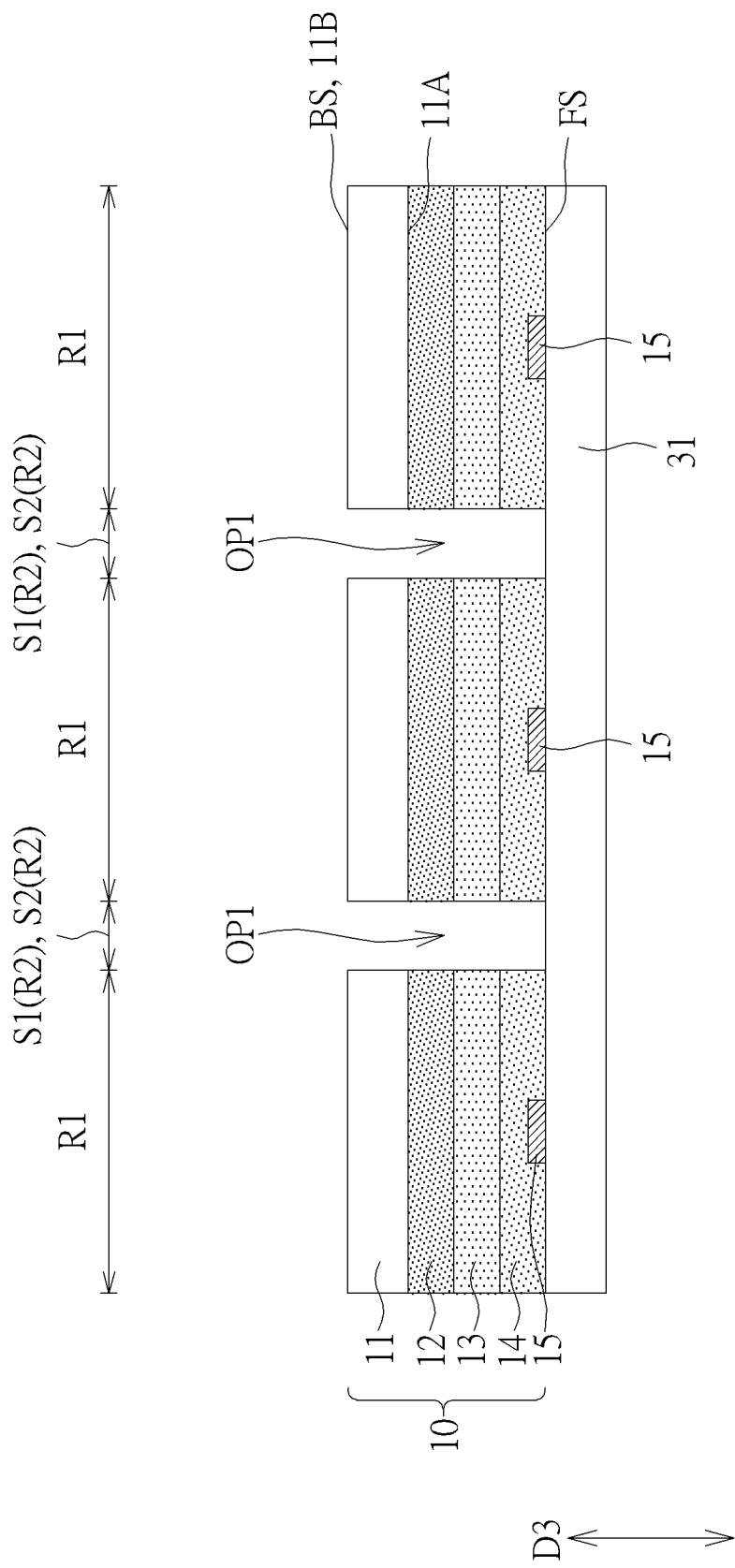
Figure 17B:
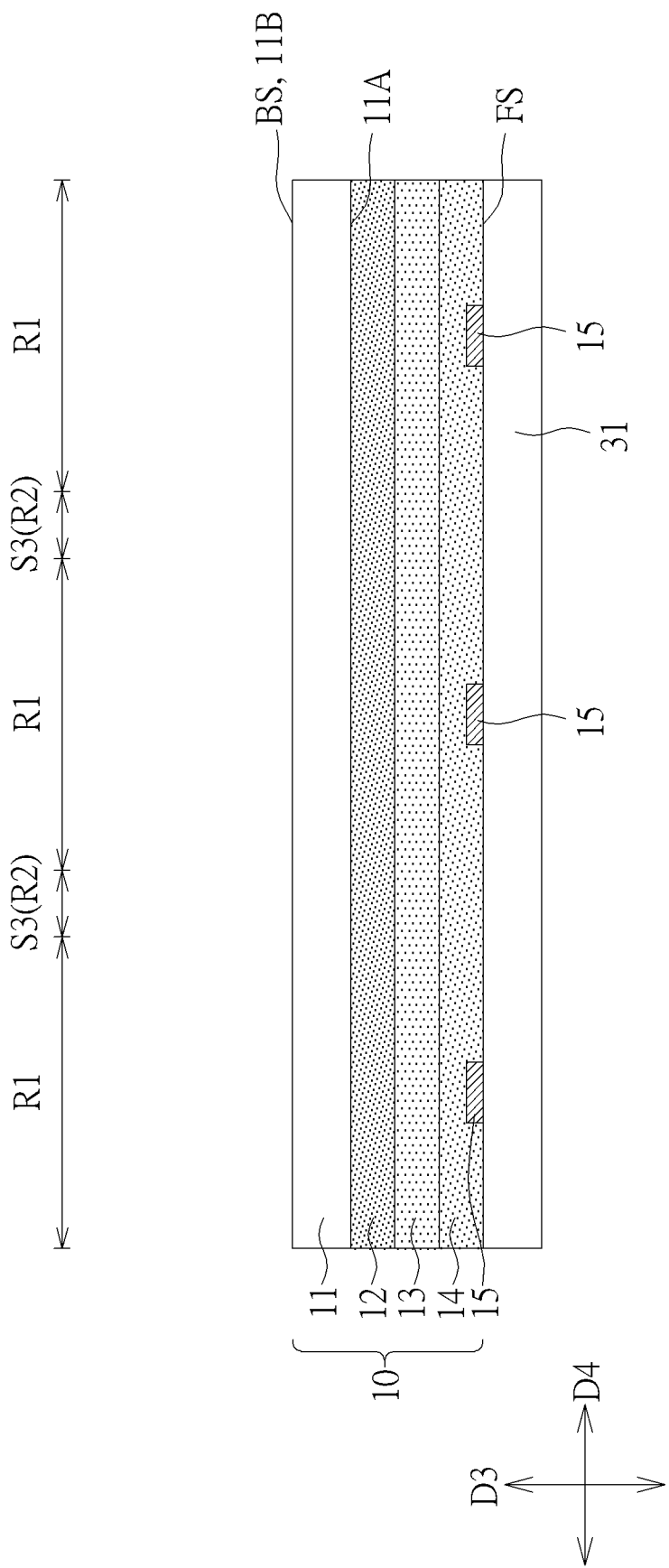
Figure 18:
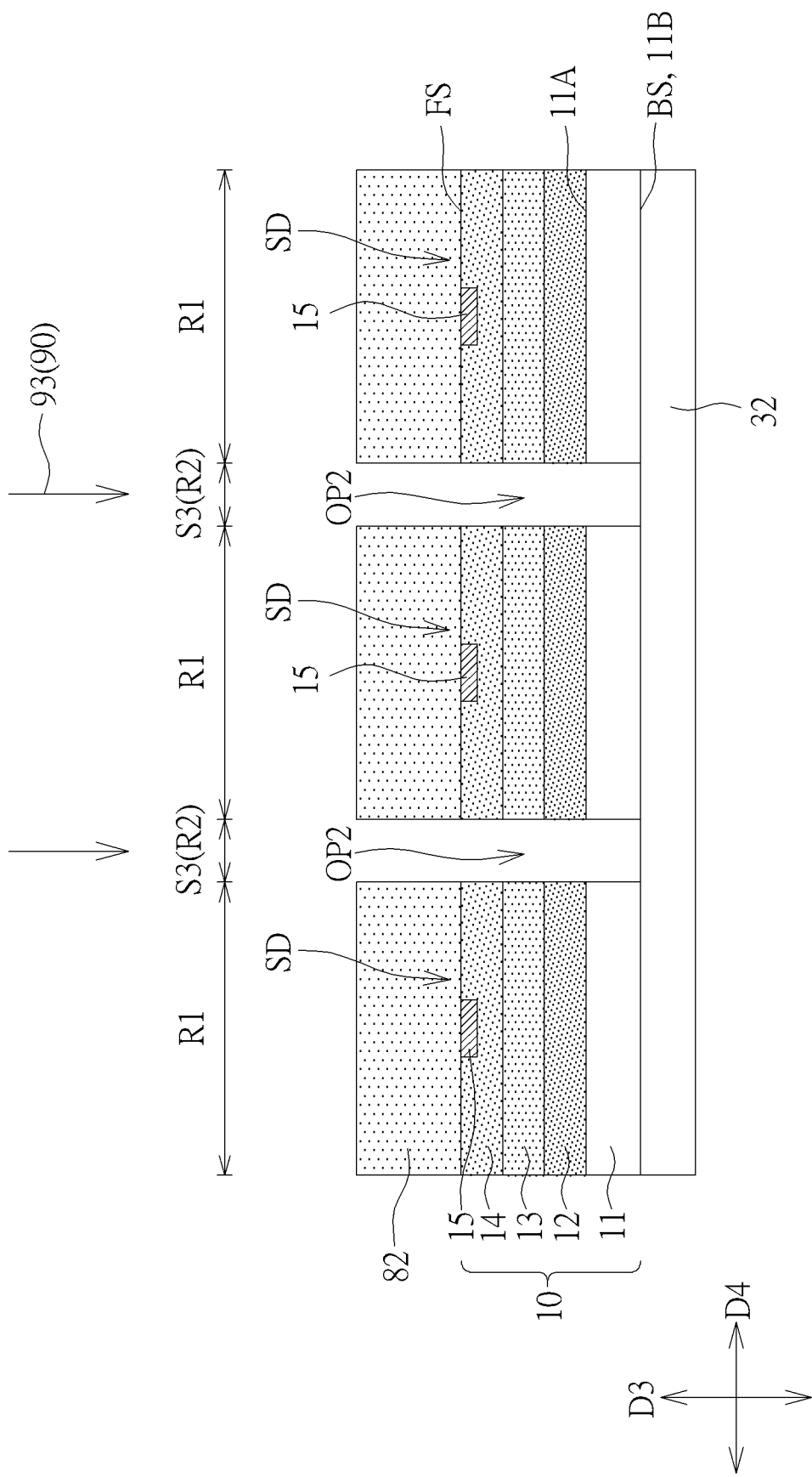
Figure 19:
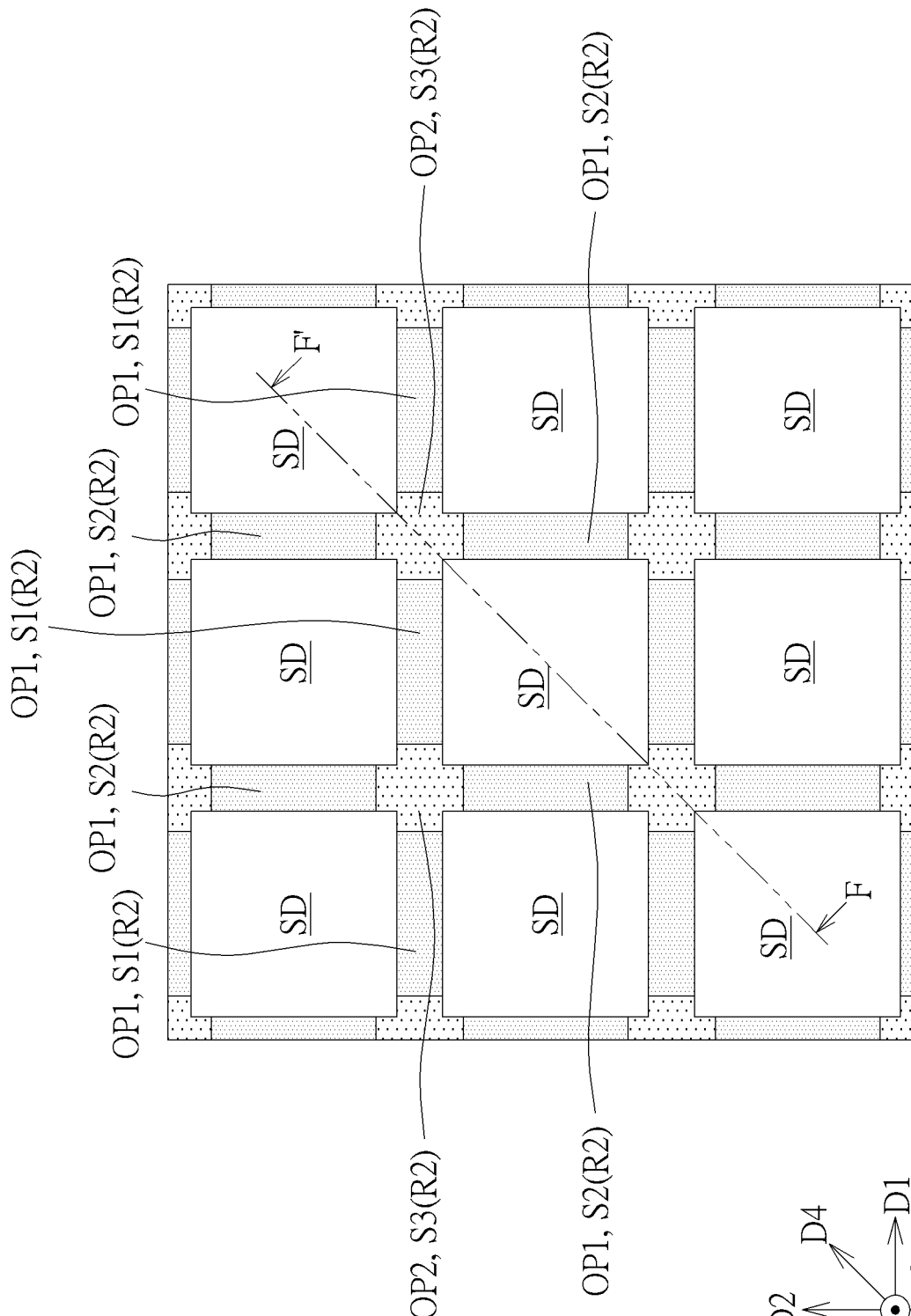

Please refer to FIGS. 13, 14, 15A, 15B, 16, 17A, 17B, 18, and 19. FIGS. 13, 14, 15A, 15B, 16, 17A, 17B, 18, and 19 are schematic drawings illustrating a manufacturing method of a semiconductor device according to a third embodiment of the present invention, wherein FIG. 14 is a schematic drawing in a step subsequent to FIG. 13, FIG. 15A is a cross-sectional diagram taken along a line C-C' in FIG. 14 or a cross-sectional diagram taken along a line D-D' in FIG. 14, FIG. 15B is a cross-sectional diagram taken along a line E-E' in FIG. 14, FIG. 16 is a schematic drawing in a step subsequent to FIG. 15A, FIG. 17A is a schematic drawing in a step subsequent to FIG. 16, FIG. 17B is a cross-sectional schematic drawing of FIG. 17A in another direction (such as a fourth direction D4), FIG. 18 is a schematic drawing in a step subsequent to FIG. 17B, FIG. 19 is a schematic drawing illustrating a top-view corresponding to FIG. 18, and FIG. 18 may be regarded as a cross-sectional diagram taken along a line F-F' in FIG. 19. As shown in FIG. 13, in some embodiments, the scribe lane region R2 may further include a plurality of corner segments S3, each of the corner segments S3 located between two of the first segments S1 adjacent to each other in the first direction D1 and located between two of the second segments S2 adjacent to each other in the second direction D2, and the first segment S1 may not be directly connected with the second segment S2.

As shown in FIG. 14, FIG. 15A, and FIG. 15B, the first cutting step 91 in the singulation process 90 may be carried out to the first semiconductor wafer 10, and the first semiconductor wafer 10 may be etched for forming the first openings OP1 in the first semiconductor wafer 10. In some embodiments, the first openings OP1 may be formed in the first segments S1 and the second segments S2 respectively, and the first openings OP1 may be separated from one another. For example, some of the first openings OP1 may be formed in the first segments S1 and other first openings OP1 may be formed in the second segments S2. The first opening OP1 formed in the first segment S1 may be elongated in the first direction D1, the first opening OP1 formed in the second segment S2 may be elongated in the second direction D2, and the first openings OP1 located adjacent to each other may be separated from each other by the corner segment S3. After the first cutting step 91, a part of each of the first openings OP1 may extend from the first surface 11A of the first substrate 11 toward the second surface 11B of the first substrate 11 in the third direction D3, and each of the first openings OP1 does not penetrate through the first semiconductor wafer 10 and the first substrate 11.

As shown in FIGS. 14, 15A, 15B, 16, 17A, and 17B, after the first cutting step 91 an before the thinning step 92, the protection film 31 may be attached to the front surface FS of the first semiconductor wafer 10, the thinning step 92 may be performed on the back surface BS of the first semiconductor wafer 10 (i.e. the second surface 11B of the first substrate 11) subsequently for thinning the first substrate 11 in the first semiconductor wafer 10, and each of the first openings OP1 may penetrate through the first semiconductor wafer 10 and the first substrate 11 after the thinning step 92 accordingly. In some embodiments, FIG. 17B may be regarded as a cross-sectional diagram of FIG. 17A taken along the fourth direction D4, the fourth direction D4 may be substantially orthogonal to the third direction D3, and the fourth direction D4 may be not perpendicular to the first direction D1 and the second direction D2, but not limited thereto. It is worth noting that, the joint area between the protection film 31 and the front surface FS of the first semiconductor wafer 10 may be relatively increased because the first openings OP1 are separated from one another and the die regions R1 of the first semiconductor wafer 10 are connected with one another via the corner segments S3 of the scribe lane region R2 in the thinning step 92, the bonding strength between first semiconductor wafer 10 and the protection film 31 may be increased accordingly, and that is beneficial to the thinning step 92 and the manufacturing yield thereof.

Subsequently, as shown in FIGS. 16, 17A, 17B, 18, and 19, after the thinning step 92 and before the second cutting step 93, the support substrate 32 may be attached to the back surface BS of the first semiconductor wafer 10, the protection film 31 may be removed for exposing the front surface FS of the first semiconductor wafer 10, and the second cutting step 93 may be subsequently performed on the front surface FS of the first semiconductor wafer 10 accordingly. The second cutting step 93 is then carried out for forming the second openings OP2 and cutting at least a portion of the first semiconductor wafer 10 into the semiconductor dies SD separated from one another. In some embodiments, each of the second openings OP2 may be formed in one of the corner segments S3, and each of the second openings OP2 may be directly connected with the adjacent first openings OP1 for separating the semiconductor dies SD from one another. In some embodiments, the second cutting step 93 may include a dry etching process configured to remove a portion of the first semiconductor wafer 10 for forming the second openings OP2 in the corner segments S3, but not limited thereto. In some embodiments, the first semiconductor wafer 10 located at the corner segments S3 may be removed by other approaches (such as wet etching) for separating the semiconductor dies SD from one another according to other design requirements. In the manufacturing method of this embodiment, the first openings OP1 elongated in the first direction D1 and the first openings OP1 elongated in the second direction D2 may be formed by the etching approach, the distance between adjacent die regions R1 may be reduced, and the usable area on the first semiconductor wafer 10 may be increased accordingly.

Please refer to FIG. 20 and FIG. 18. FIG. 20 is a schematic drawing illustrating a manufacturing method of a semiconductor device according to a fourth embodiment of the present invention, and FIG. 20 may be regarded as a cross-sectional diagram taken along a line G-G' in FIG. 20. As shown in FIG. 20 and FIG. 18, in some embodiments, the second cutting step 93 may include a wet etching process configured to remove a part of the first semiconductor wafer 10 for forming the second openings OP2 in the corner segments S3, the wet etching process may be used to round the corners of each of the semiconductor dies SD, and the corner side surfaces of the semiconductor die SD (such as the corner side surfaces F3 shown in FIG. 11) may become curved surfaces accordingly, but not limited thereto. In some embodiments, the second cutting step 93 may include a dry etching process and a wet etching process carried out after the dry etching process for forming the second openings OP2 and rounding the corners of each of the semiconductor dies SD, but not limited thereto.

Please refer to FIG. 20, FIG. 18, and FIG. 19. In some embodiment, FIG. 18 may be regarded as a cross-sectional diagram taken along a line F-F' in FIG. 19, and FIG. 20 may be regarded as a schematic drawing in a step subsequent to FIG. 19. Therefore, as shown in FIGS. 18-20, in some embodiments, a wet etching process may be performed after the second cutting steps 93 for rounding the corners of each of the semiconductor dies SD. In other words, the wet etching process may be carried out after forming the second openings OP2 for rounding the corner side surfaces of each of the semiconductor dies SD.

To summarize the above descriptions, in the semiconductor die and the manufacturing method of the semiconductor device according to the present invention, the first cutting step, the second cutting step, and the thinning step between the first cutting step and the second cutting step may be performed to the semiconductor wafer for cutting the semiconductor wafer and forming the semiconductor dies separated from one another. The first cutting step and/or the second cutting step may be carried out by etching for reducing the distance between adjacent die regions and increasing the usable area on the semiconductor wafer. Additionally, the joint area between the protection film and the semiconductor wafer may be relatively increased because the second cutting step is carried out after the thinning step, the bonding strength between the semiconductor wafer and the protection film may be increased accordingly, and that is beneficial to the thinning step and the manufacturing yield thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
  providing a semiconductor wafer having die regions and a scribe lane region surrounding each of the die regions; and
  performing a singulation process to the semiconductor wafer for forming semiconductor dies separated from one another, wherein each of the semiconductor dies is formed in one of the die regions, and the singulation process comprises:
    a first cutting step for forming first openings in the semiconductor wafer by etching the semiconductor wafer, wherein each of the first openings is formed in the scribe lane region, and a portion of the semiconductor wafer is located between each of the first openings and a back surface of the semiconductor wafer in a thickness direction of the semiconductor wafer;
    a thinning step performed to the semiconductor wafer after the first cutting step, wherein the portion of the semiconductor wafer located between each of the first openings and the back surface of the semiconductor wafer is removed by the thinning step and each of the first openings penetrates through the semiconductor wafer after the thinning step; and a second cutting step performed after the thinning step for forming second openings, wherein each of the second openings penetrates through the semiconductor wafer for separating the semiconductor dies, the second openings are formed by removing a part of the semiconductor wafer in the second cutting step, and a width of each of the second openings is greater than a width of each of the first openings.

2. The manufacturing method of the semiconductor device according to claim 1, wherein the scribe lane region comprises:

first segments, wherein each of the first segments is elongated in a first direction; and second segments, wherein each of the second segments is elongated in a second direction, and the second direction is perpendicular to the first direction.

3. The manufacturing method of the semiconductor device according to claim 2, wherein each of the first openings is elongated in the first direction and formed in one of the first segments, and each of the second openings is elongated in the second direction and formed in one of the second segments.

4. The manufacturing method of the semiconductor device according to claim 3, wherein the first openings and the second openings intersect.

5. The manufacturing method of the semiconductor device according to claim 2, wherein the first openings are formed in the first segments and the second segments, and the first openings are separated from one another.

6. The manufacturing method of the semiconductor device according to claim 5, wherein the scribe lane region further comprises:

corner segments, wherein each of the corner segments is located between two of the first segments adjacent to each other in the first direction and located between two of the second segments adjacent to each other in the second direction, and each of the second openings is formed in one of the corner segments.

7. The manufacturing method of the semiconductor device according to claim 1, wherein the first cutting step comprises a dry etching process configured to remove a part of the semiconductor wafer for forming the first openings.

8. The manufacturing method of the semiconductor device according to claim 7, wherein the second cutting step comprises a saw blade cutting process configured to form the second openings.

9. The manufacturing method of the semiconductor device according to claim 7, wherein the second cutting step comprises another dry etching process configured to remove the part of the semiconductor wafer.

10. The manufacturing method of the semiconductor device according to claim 9, further comprising:

performing a wet etching process after the second cutting step for rounding corners of each of the semiconductor dies.

11. The manufacturing method of the semiconductor device according to claim 7, wherein the second cutting step comprises a wet etching process configured to remove the part of the semiconductor wafer.

12. The manufacturing method of the semiconductor device according to claim 1, wherein the semiconductor wafer comprises:

a substrate having a first surface and a second surface opposite to the first surface in the thickness direction of the semiconductor wafer; and an active device layer disposed on the first surface of the substrate, wherein a part of each of the first openings extends from the first surface toward the second surface in the thickness direction of the semiconductor wafer, and a portion of the substrate is located between each of the first openings and the second surface of the substrate in the thickness direction of the semiconductor wafer before the thinning step.

13. The manufacturing method of the semiconductor device according to claim 12, wherein a thickness of the substrate is reduced by the thinning step, and the portion of the substrate located between each of the first openings and the second surface of the substrate in the thickness direction of the semiconductor wafer is removed by the thinning step.

14. The manufacturing method of the semiconductor device according to claim 1, further comprising:

attaching a protection film to a front surface of the semiconductor wafer after the first cutting step and before the thinning step; and removing the protection film after the thinning step and before the second cutting step.

15. The manufacturing method of the semiconductor device according to claim 14, further comprising:

attaching a support substrate to the back surface of the semiconductor wafer after the thinning step and before the second cutting step.

16. The manufacturing method of the semiconductor device according to claim 1, wherein each of the second openings exposes a part of a sidewall of the semiconductor wafer.

* * * * *